US009843315B2

(12) United States Patent
Ware et al.

(10) Patent No.: US 9,843,315 B2
(45) Date of Patent: Dec. 12, 2017

(54) DATA TRANSMISSION USING DELAYED TIMING SIGNALS

(71) Applicant: Rambus Inc., Sunnyvale, CA (US)

(72) Inventors: Frederick A. Ware, Los Altos Hills, CA (US); Ely Tsern, Los Altos, CA (US); Brian Leibowitz, San Francisco, CA (US); Jared Zerbe, Woodside, CA (US)

(73) Assignee: Rambus Inc., Sunnyvale, CA (US)

( * ) Notice: Subject to any disclaimer, the term of this patent is extended or adjusted under 35 U.S.C. 154(b) by 599 days.

(21) Appl. No.: 14/351,955

(22) PCT Filed: Oct. 26, 2012

(86) PCT No.: PCT/US2012/062301
§ 371 (c)(1),
(2) Date: Apr. 15, 2014

(87) PCT Pub. No.: WO2013/066774
PCT Pub. Date: May 10, 2013

(65) Prior Publication Data
US 2014/0293710 A1    Oct. 2, 2014

Related U.S. Application Data

(60) Provisional application No. 61/554,492, filed on Nov. 1, 2011, provisional application No. 61/711,660, filed on Oct. 9, 2012.

(51) Int. Cl.
*G06F 1/04*    (2006.01)
*G06F 1/12*    (2006.01)
(Continued)

(52) U.S. Cl.
CPC ........... *H03K 5/13* (2013.01); *G06F 13/1689* (2013.01); *G11C 7/1066* (2013.01);
(Continued)

(58) Field of Classification Search
CPC ... H03K 5/13; G06F 13/1689; G06F 13/4243; G06F 13/00; G11C 7/1066;
(Continued)

(56) References Cited

U.S. PATENT DOCUMENTS 6,003,118 A * 12/1999 Chen ..................... G06F 1/10
    711/167
6,788,593 B2    9/2004 Ware et al.
(Continued)

OTHER PUBLICATIONS

Hossain et al., "7.4 Gb/s 6.8 mW Source Synchronous Receiver in 65 nm CMOS," IEEE Journal of Solid-State Circuits, vol. 46, No. 6, pp. 1337-1348, Jun. 2011. 12 pages.
(Continued)

*Primary Examiner* — Ji H Bae
(74) *Attorney, Agent, or Firm* — Fenwick & West LLP

(57) ABSTRACT

An integrated circuit includes a delay circuit and first and second interface circuits. The delay circuit delays a first timing signal by an internal delay to generate an internal timing signal. The first interface circuit communicates data to an external device in response to the internal timing signal. The second interface circuit transmits an external timing signal for capturing the data in the external device. An external delay is added to the external timing signal in the external device to generate a delayed external timing signal. The delay circuit sets the internal delay based on a comparison between the delayed external timing signal and a calibration signal transmitted by the first interface circuit.

14 Claims, 23 Drawing Sheets

(51) Int. Cl.
*G06F 3/00* (2006.01)
*H03K 5/13* (2014.01)
*G11C 7/10* (2006.01)
*G11C 7/22* (2006.01)
*G06F 13/16* (2006.01)
*G11C 29/02* (2006.01)
*G06F 13/42* (2006.01)
*G06F 13/00* (2006.01)
*G11C 7/04* (2006.01)

(52) U.S. Cl.
CPC .............. *G11C 7/1093* (2013.01); *G11C 7/22* (2013.01); *G11C 29/022* (2013.01); *G11C 29/023* (2013.01); *G11C 29/028* (2013.01); *G06F 13/00* (2013.01); *G06F 13/4243* (2013.01); *G11C 7/04* (2013.01)

(58) Field of Classification Search
CPC ....... G11C 7/1093; G11C 7/22; G11C 29/022; G11C 29/023; G11C 29/028; G11C 7/04
USPC ................... 713/503, 401; 710/61; 714/163
See application file for complete search history.

(56) References Cited

U.S. PATENT DOCUMENTS

| | | |
|---|---|---|
| 6,912,680 B1 | 6/2005 | Keeth |
| 6,959,016 B1 | 10/2005 | Keeth et al. |
| 7,269,212 B1 | 9/2007 | Chau et al. |
| 7,301,831 B2 | 11/2007 | Ware |
| 7,496,781 B2 | 2/2009 | Tamura et al. |
| 7,688,925 B2 | 3/2010 | Lee et al. |
| 7,830,735 B2 | 11/2010 | Ware et al. |
| 7,864,625 B2 | 1/2011 | Carpenter et al. |
| 8,116,420 B2 | 2/2012 | Ali et al. |
| 2003/0123589 A1 | 7/2003 | Glenn et al. |
| 2007/0217559 A1 | 9/2007 | Stott et al. |
| 2008/0123444 A1 | 5/2008 | Patel et al. |
| 2008/0123454 A1* | 5/2008 | Bae ................ G11C 5/063 365/206 |
| 2008/0192563 A1 | 8/2008 | Cho |
| 2010/0271092 A1 | 10/2010 | Zerbe et al. |
| 2010/0271094 A1* | 10/2010 | Hassan ............. G11C 7/1051 327/161 |
| 2010/0315142 A1 | 12/2010 | Zerbe |
| 2011/0047319 A1* | 2/2011 | Jeon ................ G06F 13/4243 711/103 |
| 2012/0137084 A1* | 5/2012 | Ok ................... G11C 7/1066 711/154 |
| 2012/0176850 A1* | 7/2012 | Do ...................... G11C 8/18 365/193 |
| 2014/0075237 A1 | 3/2014 | Ware |

OTHER PUBLICATIONS

International Search Report and Written Opinion dated Jan. 10, 2013 in International Application No. PCT/US2012/062301. 19 pages.

Zerbe et al., "A5.6Gb/s 2.4mW/Gb/s Bidirectional Link With 8ns Power-On," 2011 Symposium on VLSI Circuits Digest of Technical Papers, pp. 82-83. 2 pages.

EP Response with EP Appln. No. 12845819.7 filed on Jun. 23, 2016 in Response to the Extended European Search Report dated Jan. 5, 2016 and the Communication Pursuant to Rules 70(2) and 70a(2) EPC Dated Jan. 22, 2016. 21 Pages.

Extended European Search Report dated Jan. 5, 2016 for EP Appln. No. 12845819.7. 8 Pages.

* cited by examiner

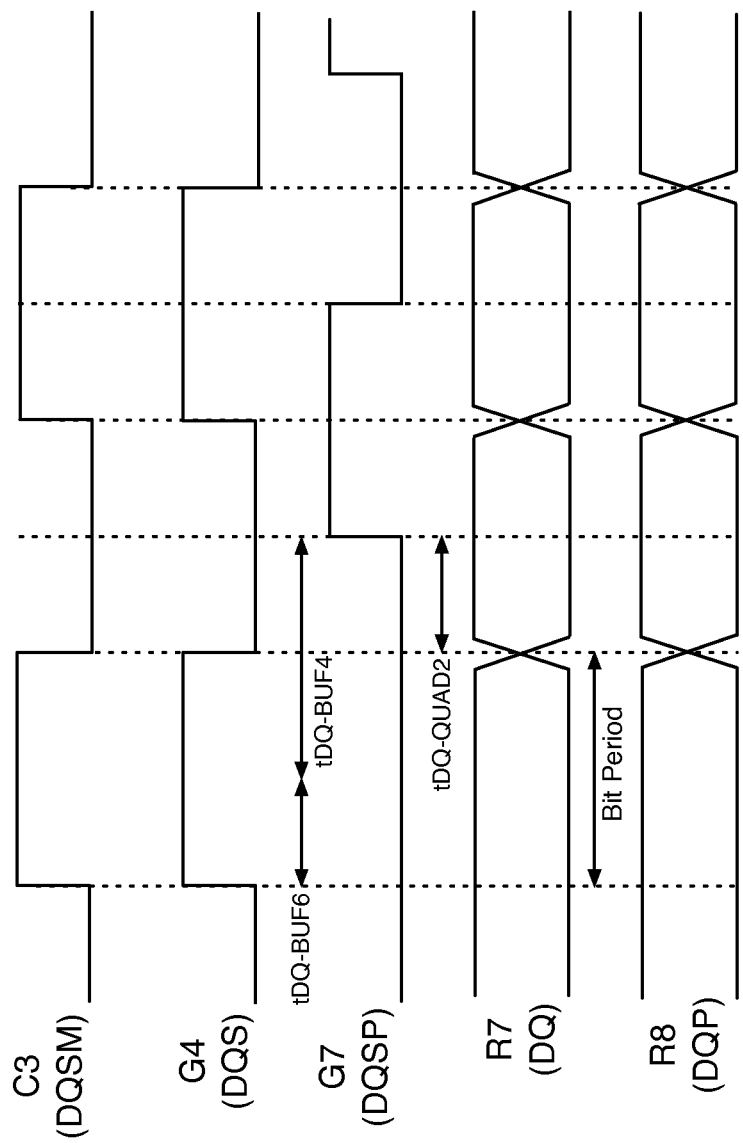

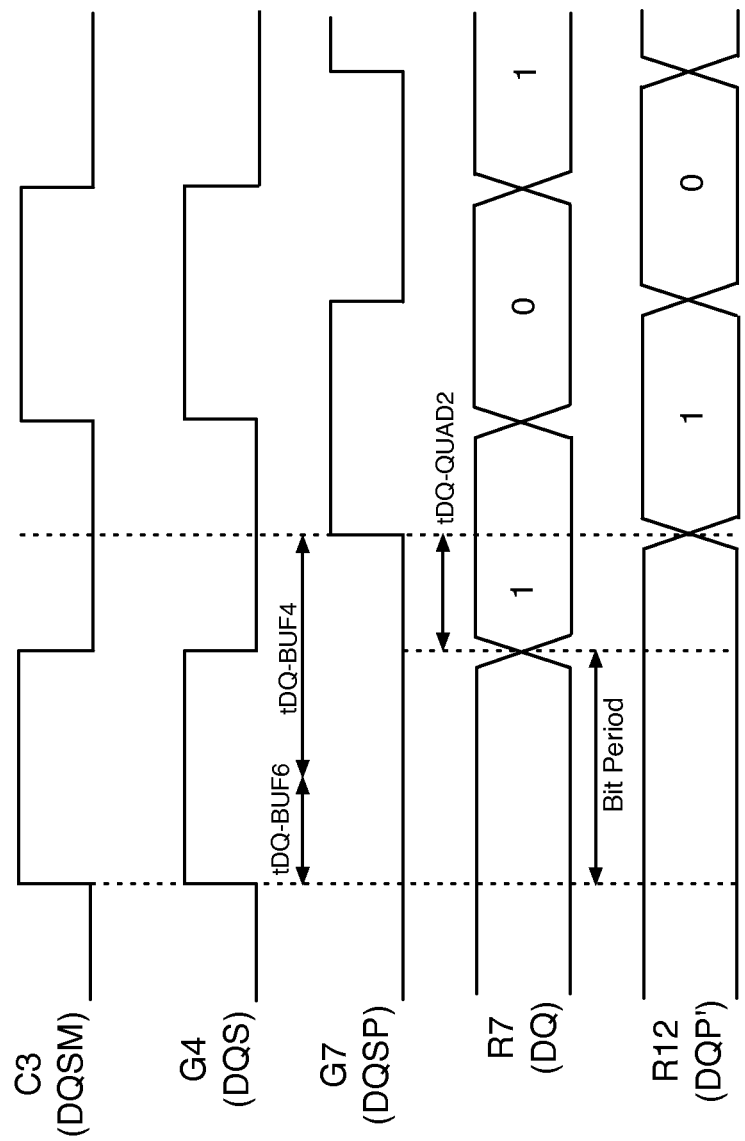

DATA TRANSMISSION USING DELAYED TIMING SIGNALS

CROSS REFERENCES TO RELATED APPLICATIONS

This patent application claims the benefit of U.S. provisional patent application 61/554,492, filed Nov. 1, 2011, and U.S. provisional patent application 61/711,660, filed Oct. 9, 2012, both of which are incorporated by reference herein in their entireties.

TECHNICAL FIELD

The present disclosure relates to electronic circuits, and more particularly, to techniques for data transmission using delayed timing signals.

BACKGROUND

In some computing systems, a processor integrated circuit stores data in a memory integrated circuit during write operations. The processor integrated circuit accesses stored data from the memory integrated circuit during read operations. In a source synchronous system, a timing signal is transmitted between the processor and memory integrated circuits along with the data during read and write operations.

During a write operation, write data and a timing signal are transmitted from the processor integrated circuit to the memory integrated circuit. A buffer circuit in the memory integrated circuit buffers the timing signal to generate a buffered timing signal. The buffered timing signal is provided to receiving circuits in the memory integrated circuit. Each of the receiving circuits in the memory integrated circuit includes a replica circuit. The replica circuits delay the write data to generate delayed write data signals. Each of the replica circuits generates a delay in one of the delayed write data signals that matches the delay provided to the buffered timing signal by the buffer circuit. The receiving circuits in the memory integrated circuit capture the write data in the delayed write data signals. The write data is stored in a memory circuit.

During a read operation, read data and a timing signal are transmitted from the memory integrated circuit to the processor integrated circuit. A buffer circuit in the processor integrated circuit buffers the timing signal to generate a buffered timing signal. The buffered timing signal is provided to receiving circuits in the processor integrated circuit. Each of the receiving circuits in the processor integrated circuit includes a replica circuit. The replica circuits in the processor integrated circuit delay the read data to generate delayed read data signals. Each of the replica circuits generates a delay in one of the delayed read data signals that matches the delay provided to the buffered timing signal by the buffer circuit in the processor integrated circuit. The receiving circuits in the processor integrated circuit capture the read data in the delayed read data signals.

BRIEF DESCRIPTION OF THE DRAWINGS

FIG. 9B is a timing diagram showing exemplary waveforms of a subset of the signals shown in FIG. 9A during normal mode.

FIG. 9C is a timing diagram showing exemplary waveforms of a subset of the signals shown in FIG. 9A during calibration mode.

DETAILED DESCRIPTION

During a write operation, a processor integrated circuit delays a first internal timing signal by a first delay to generate a second internal timing signal. A storage circuit in the processor integrated circuit captures information for the write operation in response to the second internal timing signal. The information for the write operation may be, for example, data or a command and an address. A first external timing signal and the information for the write operation are provided to a memory integrated circuit. The first external timing signal is delayed by a second delay in the memory integrated circuit to generate a third internal timing signal. A storage circuit in the memory integrated circuit captures the information for the write operation in response to the third internal timing signal. The first delay is based on the second delay. In an embodiment, the first delay is adjusted to match the second delay during a calibration mode based on a comparison between the third internal timing signal and a test signal provided from the processor integrated circuit to the memory integrated circuit.

During a read operation, a storage circuit in the memory integrated circuit captures data in response to a fourth internal timing signal. A second external timing signal and the data are provided to the processor integrated circuit during the read operation. The second external timing signal is delayed by a third delay in the processor integrated circuit to generate a fifth internal timing signal. A storage circuit in the processor integrated circuit captures the data in response to the fifth internal timing signal. In an embodiment, the third delay is adjusted during the calibration mode to cause the third delay to have a predefined relationship to the bit period of signals that embody the data.

Figure 1:
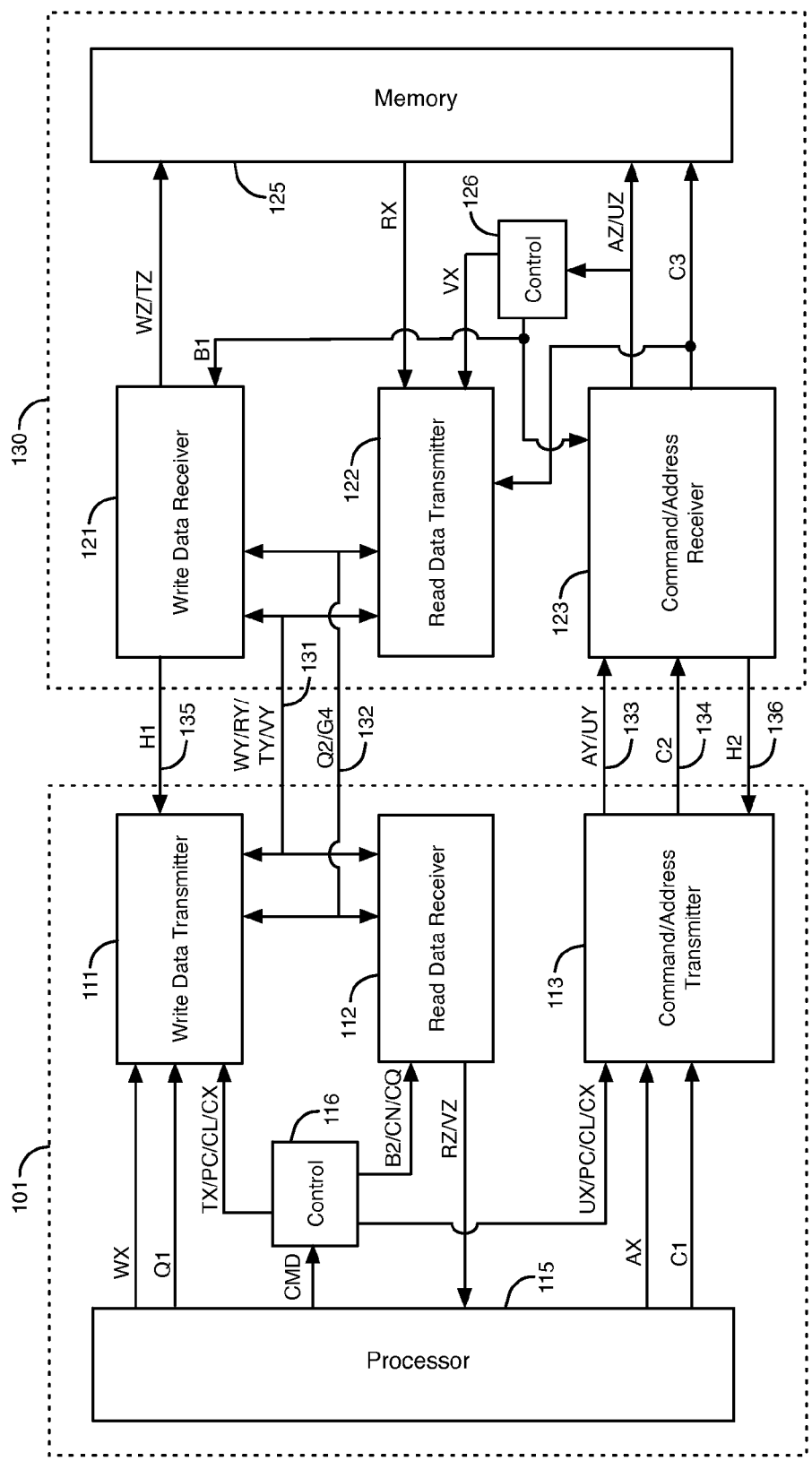
FIG. 1 illustrates an example of a system that includes a processor integrated circuit and a memory integrated circuit.

FIG. 1 illustrates an example of a system that includes a processor integrated circuit 101 and a memory integrated circuit 130. Processor integrated circuit 101 initiates a write operation to store data in memory integrated circuit 130. During each write operation, processor integrated circuit 101 transmits write data, a write command, timing signals, and an address to memory integrated circuit 130. Memory integrated circuit 130 captures the write data, the write command, and the address in response to the timing signals. Processor integrated circuit 101 delays the write data, the write command, and the address to compensate for delays provided to the timing signals in memory integrated circuit 130. Memory integrated circuit 130 stores the write data in one or more memory locations indicated by the address in response to the write command.

Processor integrated circuit 101 initiates a read operation to access data stored in memory integrated circuit 130. During each read operation, processor integrated circuit 101 transmits a read command, an address, and a first timing signal to memory integrated circuit 130. Memory integrated circuit 130 captures the read command and the address in response to the first timing signal. Processor integrated circuit 101 delays the read command and the address to compensate for delay provided to the first timing signal in memory integrated circuit 130. Memory integrated circuit 130 accesses read data at one or more memory locations indicated by the address in response to the read command. Memory integrated circuit 130 transmits the read data and a second timing signal to processor integrated circuit 101. Processor integrated circuit 101 delays the second timing signal to generate a third timing signal based on delay in the read data. Processor integrated circuit 101 captures the read data in response to the third timing signal.

Processor integrated circuit 101 includes write data transmitter circuit 111, read data receiver circuit 112, command/address transmitter circuit 113, processor circuit 115, and control circuit 116. Memory integrated circuit 130 includes write data receiver circuit 121, read data transmitter circuit 122, command/address receiver circuit 123, memory circuit 125, and control circuit 126.

Processor integrated circuit 101 may have one or more processor circuits, including processor circuit 115. Memory integrated circuit 130 may have one or more memory circuits, including memory circuit 125. In an embodiment, memory circuit 125 is a memory array circuit that has multiple banks of memory circuits. Memory circuit 125 and the other memory circuits in memory integrated circuit 130 may include any memory cell technology such as, for example, dynamic random access memory (DRAM), static random access memory (SRAM), flash, etc. As more specific examples, memory circuits may be double data rate (DDR) synchronous DRAM, extreme data rate (XDR), or Mobile XDR devices.

Throughout this description, processor integrated circuit 101 is a specific example of an integrated circuit device (i.e., memory controller device) that includes an interface to communicate with a memory integrated circuit. Other types of memory controller devices include mobile application processors, application specific integrated circuits (ASIC), graphics processing units (GPU), field programmable gate arrays (FPGA), and a system on chip (SoC), which may include processing cores or multimedia encode/decode functionality and multi-core processors as a sample set of examples.

Signals are transmitted between processor integrated circuit 101 and memory integrated circuit 130 through external conductors. The external conductors may include transmission lines, wire bond connections, and/or solder bumps. Processor integrated circuit 101 and memory integrated circuit 130 may be stacked on top of each other and directly connected through solder bumps, connected together through a printed circuit board, or connected together through one or more packages.

Processor integrated circuit 101 and memory integrated circuit 130 function in a normal mode and in a calibration mode. Processor integrated circuit 101 and memory integrated circuit 130 perform read and write operations during the normal mode. Processor integrated circuit 101 and memory integrated circuit 130 calibrate delays provided to timing signals during the calibration mode. The timing signals are used to capture read data and write data for the read and write operations, respectively.

During each write operation, processor circuit 115 generates timing signals Q1 and C1, signals WX that indicate write data for the write operation, and signals AX that indicate a write command and an address for the write operation. Timing signals Q1 and C1 are provided to inputs of write data transmitter circuit 111 and command/address transmitter circuit 113, respectively. Signals WX are provided to inputs of write data transmitter circuit 111, and signals AX are provided to inputs of command/address transmitter circuit 113.

Write data transmitter circuit 111 transmits signals WY that indicate the write data for the write operation to write data receiver circuit 121 through external bidirectional bus 131. Write data transmitter circuit 111 transmits a timing signal Q2 that is generated based on timing signal Q1 to write data receiver circuit 121 through external conductor 132. Command/address transmitter circuit 113 transmits signals AY that indicate the write command and the address for the write operation to command/address receiver circuit 123 through external bus 133. Command/address transmitter circuit 113 transmits a timing signal C2 that is generated based on timing signal C1 to command/address receiver circuit 123 through external conductor 134.

Write data receiver circuit 121 captures the write data for the write operation in response to timing signal Q2. Write data receiver circuit 121 provides signals WZ that indicate the write data for the write operation to memory circuit 125. Command/address receiver circuit 123 captures the write command and the address for the write operation in response to timing signal C2. Command/address receiver circuit 123 provides signals AZ that indicate the write command and the address for the write operation to memory circuit 125. Command/address receiver circuit 123 generates timing signal C3 based on timing signal C2. Timing signal C3 is provided to memory circuit 125 and to read data transmitter circuit 122. Memory circuit 125 may perform data storage and data access operations in response to timing signal C3.

During each read operation, processor circuit 115 generates timing signal C1 and signals AX that indicate a read command and an address for the read operation. Timing signal C1 and signals AX are provided to inputs of command/address transmitter circuit 113. Command/address transmitter circuit 113 transmits signals AY that indicate the read command and the address for the read operation to command/address receiver circuit 123 through external bus 133. Command/address transmitter circuit 113 transmits timing signal C2 that is generated based on timing signal C1 to command/address receiver circuit 123 through external conductor 134. Command/address receiver circuit 123 captures the read command and the address for the read operation in response to timing signal C2. Command/address receiver circuit 123 provides signals AZ that indicate the read command and the address for the read operation to memory circuit 125. Command/address receiver circuit 123 generates timing signal C3 based on timing signal C2.

Memory circuit 125 accesses read data stored in one or more memory locations identified by the address indicated by a first subset of signals AZ in response to the read command indicated by a second subset of signals AZ. Memory circuit 125 provides signals RX that indicate the read data to read data transmitter circuit 122. Read data transmitter circuit 122 transmits signals RY that indicate the read data for the read operation to read data receiver circuit 112 through external bidirectional bus 131. Read data transmitter circuit 122 transmits a timing signal G4 that is generated based on timing signal C3 to read data receiver circuit 112 through external conductor 132. Read data receiver circuit 112 captures the read data for the read operation in response to timing signal G4. Read data receiver circuit 112 transmits signals RZ that indicate the read data for the read operation to processor circuit 115.

During the calibration mode, processor circuit 115 provides control signals CMD to control circuit 116. Control circuit 116 generates test signals TX, test signals UX, and control signals PC, CL, CX, B2, CN, and CQ in response to control signals CMD during calibration mode. Test signals TX and control signals PC, CL, and CX are provided to write data transmitter circuit 111. Test signals UX and control signals PC, CL, and CX are provided to command/address transmitter circuit 113. Control signals B2, CN, and CQ are provided to read data receiver circuit 112. Processor circuit 115 provides timing signals Q1 and C1 to write data transmitter circuit 111 and command/address transmitter circuit 113, respectively, during calibration mode.

Write data transmitter circuit 111 generates test signals TY based on test signals TX. Write data transmitter circuit 111 transmits test signals TY to write data receiver circuit 121 through external bidirectional bus 131. Test signals TY indicate a test pattern. Write data transmitter circuit 111 transmits timing signal Q2 that is generated based on timing signal Q1 to write data receiver circuit 121 through external conductor 132 during calibration mode. Write data receiver circuit 121 captures the test pattern indicated by signals TY in response to timing signal Q2. Write data receiver circuit 121 generates test signals TZ based on test signals TY.

Write data receiver circuit 121 generates a calibration signal H1 based on the test pattern indicated by signals TY and timing signal Q2 in calibration mode. Timing signal Q2 is adjusted based on control signal PC in calibration mode. Write data receiver circuit 121 transmits the calibration signal H1 to write data transmitter circuit 111 through external conductor 135. Write data transmitter circuit 111 adjusts delays provided to signals TY based on calibration signal H1 and control signal CL in calibration mode. The delays generated in signals TY during calibration mode are used to determine delays provided to signals WY in write data transmitter circuit 111 during subsequent write operations.

Command/address transmitter circuit 113 generates test signals UY based on test signals UX. Command/address transmitter circuit 113 transmits test signals UY to command/address receiver circuit 123 through external bus 133. Test signals UY indicate a test pattern. Command/address transmitter circuit 113 transmits timing signal C2 that is generated based on timing signal C1 to command/address receiver circuit 123 through external conductor 134 during calibration mode. Command/address receiver circuit 123 captures the test pattern indicated by test signals UY in response to timing signal C2. Command/address receiver circuit 123 generates test signals UZ based on test signals UY.

Command/address receiver circuit 123 generates a calibration signal H2 based on the test pattern in signals UY and timing signal C2 in calibration mode. Timing signal C2 is adjusted based on control signal PC in calibration mode. Command/address receiver circuit 123 transmits the calibration signal H2 to command/address transmitter circuit 113 through external conductor 136. Command/address transmitter circuit 113 adjusts delays provided to signals UY based on calibration signal H2 and control signal CL in calibration mode. The delays generated in signals UY during calibration mode are used to determine delays provided to signals AY in command/address transmitter circuit 113 during subsequent read and write operations.

Test signals UZ are provided to control circuit 126. Control circuit 126 generates test signals VX and control signal B1 based on test signals UZ during calibration mode. Control signal B1 is provided to write data receiver circuit 121 and to command/address receiver circuit 123. Test signals VX are provided to read data transmitter circuit 122. Read data transmitter circuit 122 generates test signals VY based on test signals VX. Read data transmitter circuit 122 transmits test signals VY to read data receiver circuit 112 through external bidirectional bus 131. Test signals VY indicate a test pattern. Read data transmitter circuit 122 transmits timing signal G4 that is generated based on timing signal C3 to read data receiver circuit 112 through external conductor 132 during calibration mode. Read data receiver circuit 112 captures the test pattern indicated by signals VY in response to timing signal G4.

Read data receiver circuit 112 generates test signals VZ based on test signals VY. Read data receiver circuit 112 adjusts delays provided to signals VZ during the calibration mode in response to control signals B2 and CN. The delays generated for signals VZ during calibration mode are used to determine delays provided to signals RZ in read data receiver circuit 112 during subsequent read operations.

Figure 2A:
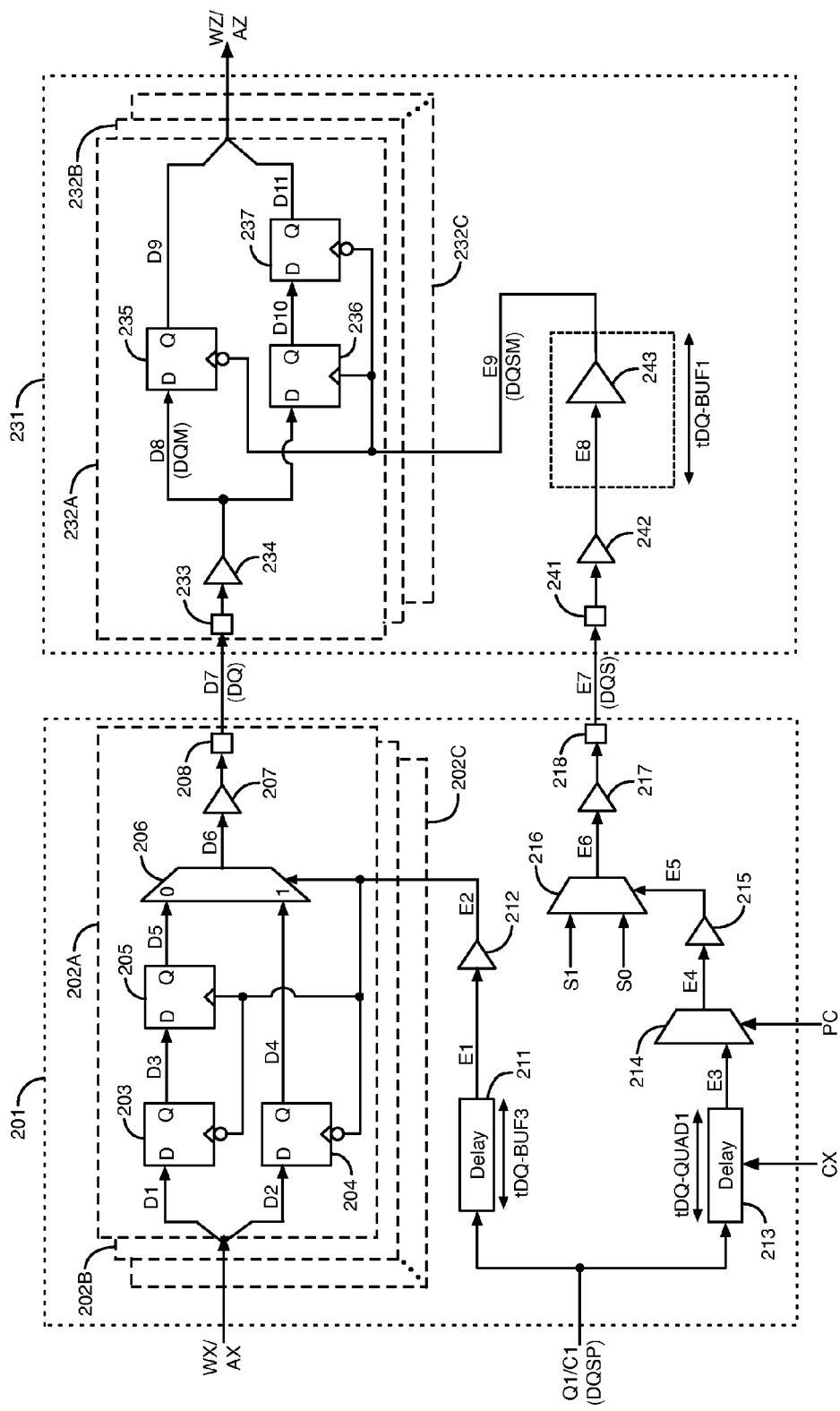
FIG. 2A illustrates an embodiment of the write data transmitter circuit and the command/address transmitter circuit of FIG. 1, and an embodiment of the write data receiver circuit and the command/address receiver circuit of FIG. 1.

FIG. 2A illustrates an embodiment of a transmitter circuit 201 and an embodiment of a receiver circuit 231. In an exemplary embodiment of FIG. 1, write data transmitter circuit 111 is a first instance of transmitter circuit 201, command/address transmitter circuit 113 is a second instance of transmitter circuit 201, write data receiver circuit 121 is a first instance of receiver circuit 231, and command/address receiver circuit 123 is a second instance of receiver circuit 231.

Transmitter circuit 201 includes transmitting circuits 202, delay circuits 211 and 213, multiplexer circuits 214 and 216, pin 218, and buffer circuits 212, 215, and 217. Transmitting circuits 202 include transmitting circuits 202A-202C. Transmitting circuit 202A includes D flip-flop circuits 203-205, multiplexer circuit 206, buffer circuit 207, and pin 208. Each of flip-flop circuits 203-205 is a storage circuit. Pins 208 and 218 are external terminals of processor integrated circuit 101. Buffer circuits 207 and 217 are interface circuits that provide signals to pins 208 and 218, respectively.

In the embodiment of FIG. 2A, transmitter circuit 201 may have any number of one or more transmitting circuits 202, such as transmitting circuits 202A-202C. Three transmitting circuits 202A-202C are shown in FIG. 2A as an example. Transmitting circuits 202B-202C and the other transmitting circuits 202 in transmitter circuit 201 have the same circuit structure as transmitting circuit 202A. Each of the transmitting circuits 202 in transmitter circuit 201 functions as described below with respect to transmitting circuit 202A.

Receiver circuit 231 includes receiving circuits 232, pin 241, and buffer circuits 242 and 243. Receiving circuits 232 include receiving circuits 232A-232C. Receiving circuit 232A includes pin 233, buffer circuit 234, and D flip-flop circuits 235-237. Each of flip-flop circuits 235-237 is a storage circuit. Pins 233 and 241 are external terminals of memory integrated circuit 130. Buffer circuits 234 and 242 are interface circuits that receive signals from pins 233 and 241, respectively.

In the embodiment of FIG. 2A, receiver circuit 231 may have any number of one or more receiving circuits 232, such as receiving circuits 232A-232C. Three receiving circuits 232A-232C are shown in FIG. 2A as an example. Receiving circuits 232B-232C and the other receiving circuits 232 in receiver circuit 231 have the same circuit structure as receiving circuit 232A. Each of the receiving circuits 232 in receiver circuit 231 functions as described below with respect to receiving circuit 232A.

During each write operation, write data is provided to the first instance of transmitter circuit 201 (i.e., an example of write data transmitter circuit 111) in signals WX, and a write command and an address are provided to the second instance of transmitter circuit 201 (i.e., an example of command/address transmitter circuit 113) in signals AX. If transmitter circuit 201 has an N number of transmitting circuits 202, processor circuit 115 generates a 2N number of signals WX and a 2N number of signals AX. Two of signals WX are provided to each of the transmitting circuits 202 in the first instance of transmitter circuit 201. Two of signals AX are provided to each of the transmitting circuits 202 in the second instance of transmitter circuit 201.

In the first instance of transmitter circuit 201, signals D1 and D2 are a subset of signals WX during write operations in normal mode. In the second instance of transmitter circuit 201, signals D1 and D2 are a subset of signals AX during read and write operations in normal mode. Signals D1 and D2 are provided to the D inputs of flip-flop circuits 203 and 204, respectively, in transmitting circuit 202A.

In the first instance of transmitter circuit 201, timing signal Q1 is provided to inputs of delay circuits 211 and 213 during write operations in normal mode. In the second instance of transmitter circuit 201, timing signal C1 is provided to the inputs of delay circuits 211 and 213 during read and write operations in normal mode. Processor circuit 115 causes timing signal Q1 to be a digital periodic signal during write operations in normal mode and in calibration mode. Processor circuit 115 causes timing signal C1 to be a digital periodic signal during read and write operations in normal mode and in calibration mode. Signals Q1 and C1 are also referred to as signal DQSP in the present disclosure with respect to FIGS. 2A-4 and 10A-11B.

Delay circuit 211 delays timing signal Q1 or C1 (DQSP) to generate a delayed timing signal E1. The delayed timing signal E1 is provided to an input of buffer circuit 212. Buffer circuit 212 buffers delayed timing signal E1 to generate timing signal E2. Timing signal E2 is provided to an inverting clock input of each of flip-flop circuits 203-204, to a clock input of flip-flop circuit 205, and to a select input of multiplexer circuit 206 in each of transmitting circuits 202.

Flip-flop circuit 203 stores the value of signal D1 at its Q output in signal D3 in response to each falling edge in timing signal E2. Flip-flop circuit 204 stores the value of signal D2 at its Q output in signal D4 in response to each falling edge in timing signal E2. Flip-flop circuit 205 stores the value of signal D3 at its Q output in signal D5 in response to each rising edge in timing signal E2. Signal D4 is provided to the 1 multiplexing input of multiplexer circuit 206, and signal D5 is provided to the 0 multiplexing input of multiplexer circuit 206.

Timing signal E2 is a periodic signal during write operations. Multiplexer circuit 206 provides the value of signal D4 to its output in signal D6 when timing signal E2 is in a logic high state. Multiplexer circuit 206 provides the value of signal D5 to its output in signal D6 when timing signal E2 is in a logic low state. Signal D6 is provided to an input of buffer circuit 207. Buffer circuit 207 buffers signal D6 to generate signal D7 at pin 208. Signal D7 is also referred to as signal DQ in the present disclosure. Signal D7 (DQ) is transmitted to pin 233 at the input of buffer circuit 234 in receiver circuit 232A. Signal D7 (DQ) corresponds to one of signals WY and to one of signals AY in FIG. 1 in respective first and second instances of transmitter circuit 201 during normal mode. Buffer circuit 234 buffers signal D7 (DQ) to generate signal D8. Signal D8 is also referred to as signal DQM with respect to FIGS. 2A-3B and 10A-10B. Signal D8 (DQM) is provided to the D inputs of flip-flop circuits 235-236.

Delay circuit 213 delays timing signal Q1 or C1 (DQSP) to generate a delayed timing E3. Control signals CX are provided to control inputs of delay circuit 213. The delay of delay circuit 213 is adjustable. The delay of delay circuit 213 varies based on changes in control signals CX. An example of delay circuit 213 is shown and described with respect to FIG. 7 and related figures in commonly-assigned U.S. provisional patent application 61/487,221, filed May 17, 2011, which is incorporated by reference herein in its entirety.

Delayed timing signal E3 is provided to a first multiplexing input of multiplexer circuit 214. Control signal PC is provided to a select input of multiplexer circuit 214. Control signal PC causes multiplexer circuit 214 to provide the value of delayed timing signal E3 to its output in timing signal E4 during normal mode. Timing signal E4 is provided to an input of buffer circuit 215. Buffer circuit 215 buffers timing signal E4 to generate timing signal E5. Timing signal E5 is provided to a select input of multiplexer circuit 216.

Signals S1 and S0 are provided to multiplexing inputs of multiplexer circuit 216. During the normal and calibration modes, signal S1 has a value that indicates a logic high state, and signal S0 has a value that indicates a logic low state. For example, signal S1 may be generated from a supply voltage, and signal S0 may be generated from a ground voltage. Timing signal E5 is a periodic signal in normal and calibration modes. Multiplexer circuit 216 provides the value of signal S1 to its output in timing signal E6 in odd numbered periods of timing signal E5. Multiplexer circuit 216 provides the value of signal S0 to its output in timing signal E6 in even numbered periods of timing signal E5. As a result, timing signal E6 has a period and a duty cycle that matches the period and duty cycle of timing signal E5.

Timing signal E6 is provided to an input of buffer circuit 217. Buffer circuit 217 buffers timing signal E6 to generate timing signal E7 at pin 218. Timing signal E7 corresponds to signals Q2 and C2 in FIG. 1 in the respective first and second instances of transmitter circuit 201. Timing signal E7 is also referred to as signal DQS in the present disclosure with respect to FIGS. 2A-4 and 10A-11A.

Timing signal E7 (DQS) is transmitted from pin 218 to pin 241 in receiver circuit 231 at the input of buffer circuit 242. Buffer circuit 242 buffers timing signal E7 (DQS) to generate timing signal E8. Timing signal E8 is provided to an input of buffer circuit 243. Buffer circuit 243 buffers timing signal E8 to generate timing signal E9. Timing signal E9 is also referred to as signal DQSM in the present disclosure with respect to FIGS. 2A-4 and 10A-11B. In an embodiment, buffer circuit 243 includes a chain of buffer circuits that are coupled together in series. The chain of buffer circuits in buffer circuit 243 may, for example, be an exponentially scaled buffer chain.

Timing signal E9 (DQSM) is provided to the inverting clock inputs of flip-flop circuits 235 and 237 and to the clock input of flip-flop circuit 236 in each of the receiving circuits 232. Flip-flop circuit 235 stores the value of signal D8 (DQM) at its Q output in signal D9 in response to each falling edge in timing signal E9 (DQSM). Flip-flop circuit 236 stores the value of signal D8 (DQM) at its Q output in signal D10 in response to each rising edge in timing signal E9 (DQSM). Flip-flop circuit 237 stores the value of signal D10 at its Q output in signal D11 in response to each falling edge in timing signal E9 (DQSM). Each of receiving circuits 232 generates a set of signals D9 and D11. The signals D9 and D11 generated by receiving circuits 232 are collectively provided as signals WZ at outputs of the first instance of receiver circuit 231. The signals D9 and D11 generated by receiving circuits 232 are collectively provided as signals AZ at outputs of the second instance of receiver circuit 231.

Figure 2B:
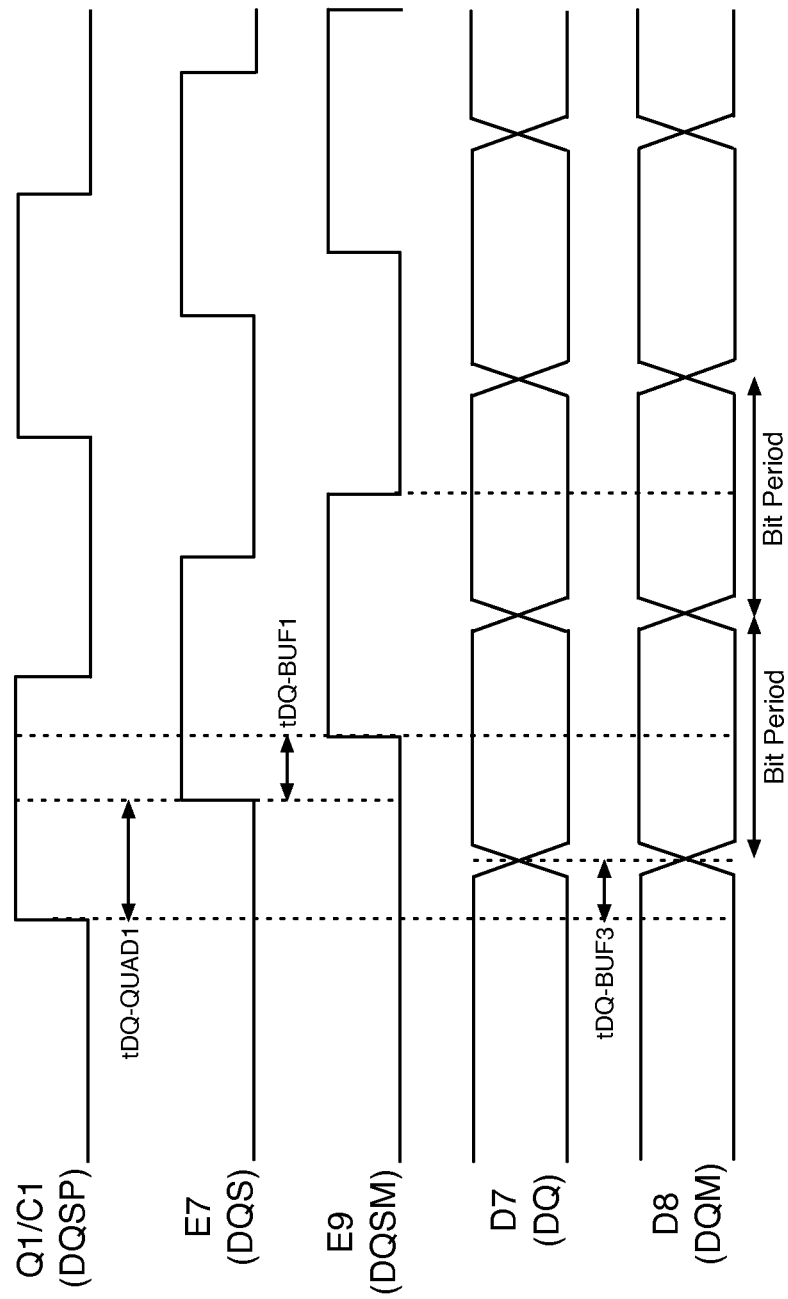
FIG. 2B is a timing diagram showing exemplary waveforms of a subset of the signals shown in FIG. 2A.

FIG. 2B is a timing diagram showing exemplary waveforms of a subset of the signals shown in FIG. 2A. The timing diagram of FIG. 2B illustrates exemplary waveforms for timing signal Q1 or C1 (DQSP), timing signal E7 (DQS), timing signal E9 (DQSM), signal D7 (DQ), and signal D8 (DQM) during normal mode. The exemplary waveforms of FIG. 2B are generated in a double data rate embodiment of FIG. 2A.

Delay circuit 213 provides a delay tDQ-QUAD1 to timing signal E7 (DQS) relative to timing signal Q1 or C1 (DQSP). In an embodiment, the delays of circuits 214-217 are small compared to the delay tDQ-QUAD1 of delay circuit 213. In some embodiments, the delay of delay circuit 213 is set by control signals CX to cause delay tDQ-QUAD1 to equal one-half the bit period of signal D8 (DQM). For example, in a double data rate embodiment, delay tDQ-QUAD1 is a quadrature delay that equals one-quarter of the period of timing signal Q1 or C1 (DQSP). Buffer circuit 243 provides a delay tDQ-BUF1 to timing signal E9 (DQSM) relative to timing signal E8. In an embodiment, the delay of buffer circuit 242 is small compared to the delay of buffer circuit 243.

Delay circuit 211 provides a delay tDQ-BUF3 to timing signal E1 relative to timing signal Q1 or C1 (DQSP). Delay circuit 211 causes the transitions in signals D7 (DQ) and D8 (DQM) to be delayed with respect to timing signal Q1 or C1 (DQSP) by delay tDQ-BUF3, as shown in FIG. 2B. The delays of buffer circuits 207, 212, and 234 are small compared to the delay tDQ-BUF3 of delay circuit 211 in the embodiment of FIG. 2B. The delays tDQ-BUF1 and tDQ-BUF3 are selected to cause the rising and falling edges of timing signal E9 (DQSM) to occur at or near the centers of the bit periods of signal D8 (DQM), as shown for example in FIG. 2B, allowing flip-flop circuits 235-236 to capture the values of signal D8 (DQM).

In an embodiment, the delay tDQ-BUF3 of delay circuit 211 is equal to or approximately equal to delay tDQ-BUF1. Because delay circuit 211 is in the circuit path that generates timing signal E2 in transmitter circuit 201, receiver circuit 231 does not delay signal D8 (DQM) by a delay equal to tDQ-BUF1 using a replica circuit in each of the receiving circuits 232. Delay circuit 211 may reduce the power consumption of the system of FIG. 2A, because delay circuit 211 eliminates the need to use a replica circuit in each of the receiving circuits 232 to generate signal D8 (DQM). For example, if receiver circuit 231 has 8 receiving circuits 232, one delay circuit 211 in transmitter circuit 201 eliminates 8 replica circuits in the receiving circuits 232.

Variations in the processes, the temperatures, and the supply voltages of integrated circuits 101 and 130 may cause the delay tDQ-BUF3 of delay circuit 211 to be larger than or smaller than the delay tDQ-BUF1 of buffer circuit 243. In an embodiment shown in and described below with respect to FIGS. 3A-3B, delay circuit 211 has an adjustable delay tDQ-BUF3 that is calibrated during the calibration mode to match delay tDQ-BUF1.

Figure 3A:
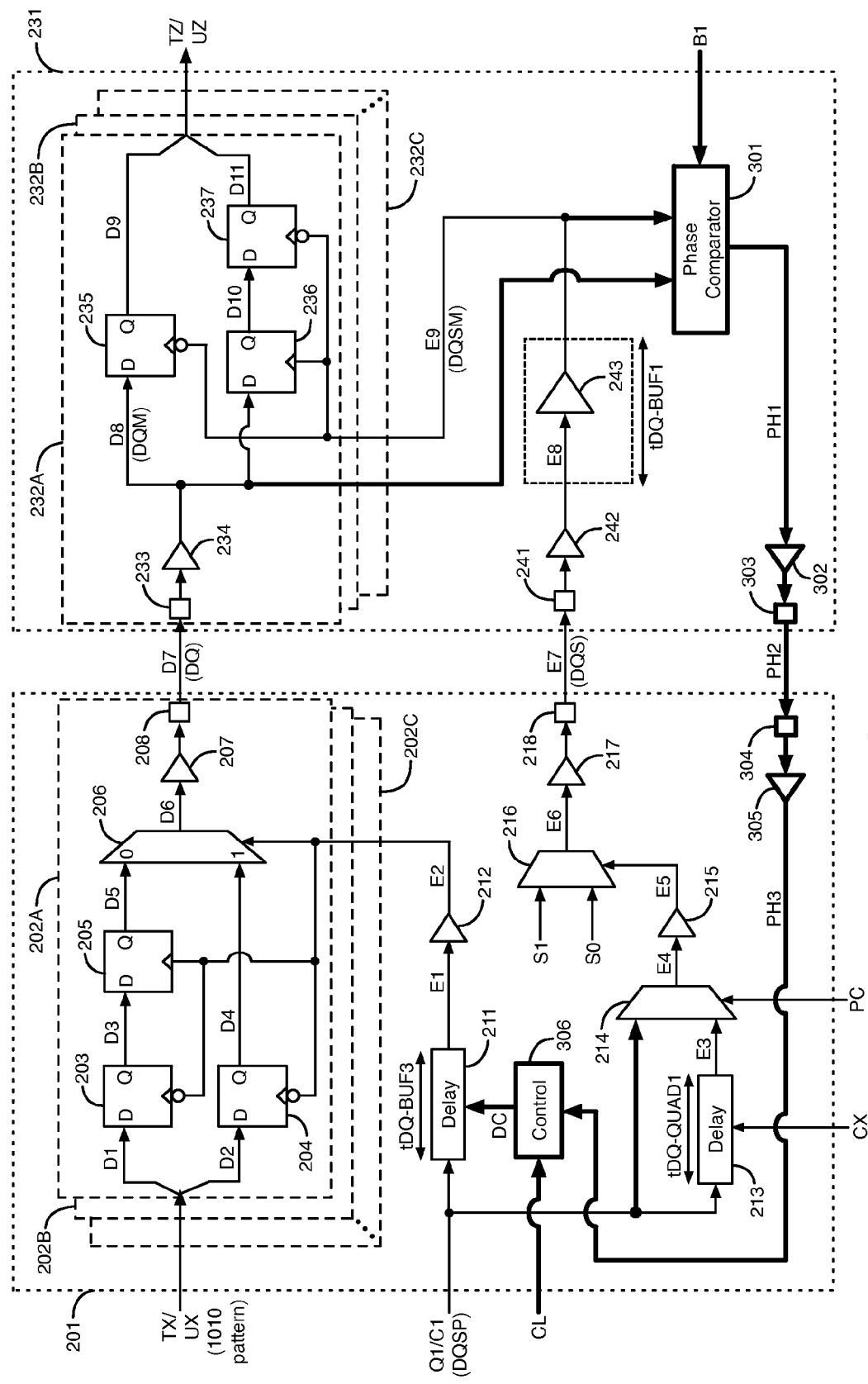
FIG. 3A illustrates additional portions of the circuits of FIG. 2A that are used to calibrate a delay provided to a timing signal during a calibration mode.

FIG. 3A illustrates additional portions of transmitter circuit 201 and receiver circuit 231 that are used to calibrate the delay tDQ-BUF3 of delay circuit 211 during the calibration mode. In the embodiment of FIG. 3A, receiver circuit 231 includes phase comparator circuit 301, buffer circuit 302, and pin 303. Transmitter circuit 201 includes pin 304, buffer circuit 305, and control circuit 306. The circuitry and signal lines shown with thick black lines in FIG. 3A indicate circuitry and signal lines that are not shown in FIG. 2A.

During calibration mode, processor circuit 115 generates test signals TX, test signals UX, and timing signals Q1 and C1 (DQSP). Test signals TX and timing signal Q1 are provided to the first instance of transmitter circuit 201 (i.e., an example of write data transmitter circuit 111), and test signals UX and timing signal C1 are provided to the second instance of transmitter circuit 201 (i.e., an example of command/address transmitter circuit 113). Two of signals TX are provided to each of the transmitting circuits 202 in the first instance of transmitter circuit 201. Two of signals UX are provided to each of the transmitting circuits 202 in the second instance of transmitter circuit 201.

In the first instance of transmitter circuit 201, signals D1 and D2 are a subset of signals TX during calibration mode. In the second instance of transmitter circuit 201, signals D1 and D2 are a subset of signals UX during calibration mode.

Signals D1 and D2 are provided to the D inputs of flip-flop circuits 203 and 204, respectively, as described above. Signal D7 (DQ) corresponds to one of signals TY and to one of signals UY in FIG. 1 in the respective first and second instances of transmitter circuit 201 during calibration mode. Signal D7 (DQ) has a test pattern that may be, for example, a repeating pattern of logic high and low states (i.e., 1010 . . . ) in calibration mode.

As shown in FIG. 3A, timing signal Q1 or C1 (DQSP) is provided to a second multiplexing input of multiplexer circuit 214 in the respective first and second instances of transmitter circuit 201. During calibration mode, control circuit 116 generates a logic state in control signal PC that causes multiplexer circuit 214 to provide the value of timing signal Q1 or C1 (DQSP) directly to its output in signal E4, bypassing delay circuit 213. As result, timing signal E7 (DQS) is not delayed by the delay of delay circuit 213.

Figure 3B:
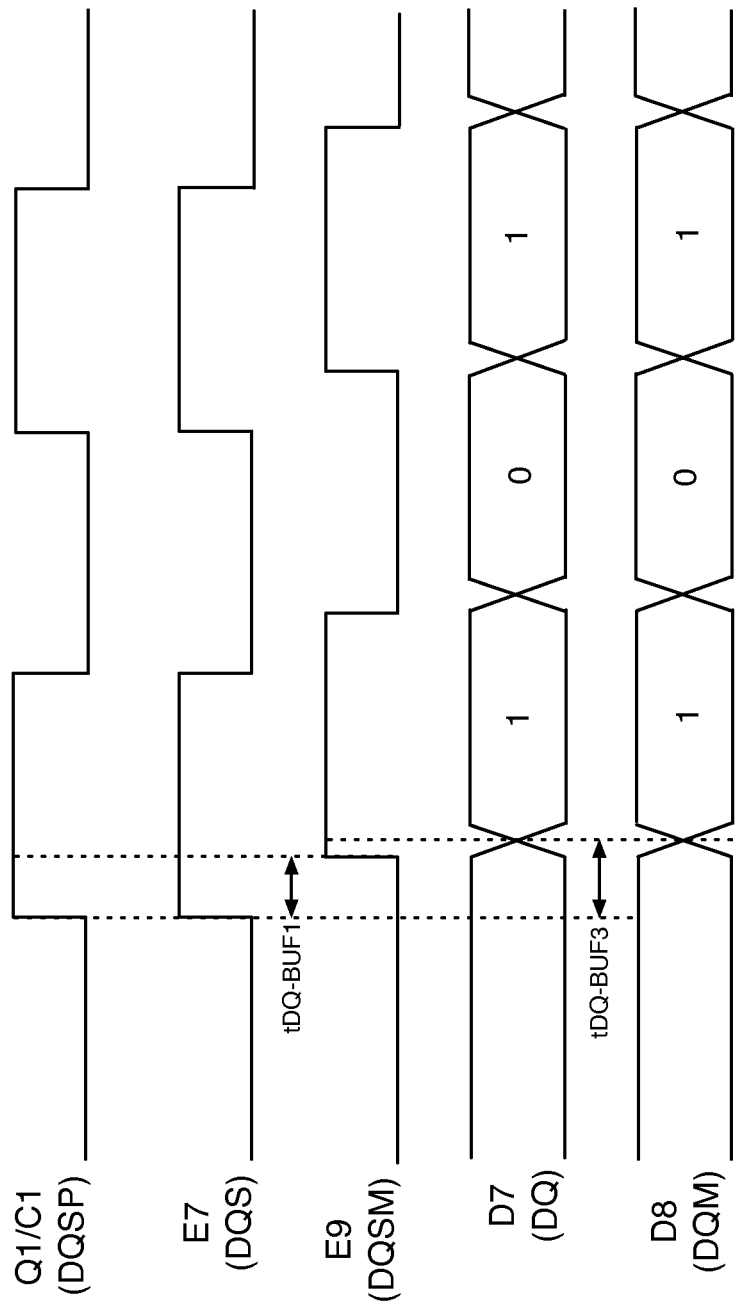
FIG. 3B is a timing diagram showing exemplary waveforms of a subset of the signals shown in FIG. 3A.

FIG. 3B is a timing diagram showing exemplary waveforms of a subset of the signals shown in FIG. 3A. The timing diagram of FIG. 3B illustrates exemplary waveforms for timing signal Q1 or C1 (DQSP), timing signal E7 (DQS), timing signal E9 (DQSM), signal D7 (DQ), and signal D8 (DQM) during calibration mode. The exemplary waveforms of FIG. 3B are generated in a double data rate embodiment of FIG. 3A.

As shown in FIG. 3B, the rising and falling edges of timing signal E7 (DQS) are substantially aligned with the corresponding rising and falling edges of timing signal Q1 or C1 (DQSP). In this embodiment, the delays of circuits 214-217 are negligible. The transitions in signals D7 (DQ) and D8 (DQM) are offset by delay tDQ-BUF3 after corresponding rising and falling edges of timing signal E7 (DQS), as shown in FIG. 3B. If delay tDQ-BUF3 equals delay tDQ-BUF1, then the rising and falling edges of timing signal E9 (DQSM) align with corresponding transitions in signal D8 (DQM). However, variations in the processes, temperatures, and supply voltages of integrated circuits 101 and 130 may cause delay tDQ-BUF3 to be different than delay tDQ-BUF1, as shown for example in FIG. 3B.

In an embodiment, control circuit 116 generates a constant logic high state in signal D1 and a constant logic low state in signal D2 during calibration mode. When signal D1 is in a constant logic high state (1), and signal D2 is in a constant logic low state (0), multiplexer circuit 206 generates a repeating test pattern of 1010101010 . . . in signals D7-D8, as shown in FIG. 3B. A subset of signals TX or UX are data mask signals that instruct memory integrated circuit 130 not to store the test pattern in memory circuit 125.

During normal mode, control circuit 126 generates a value in signal B1 that disables phase comparator circuit 301. During calibration mode, control circuit 126 generates a value in signal B1 that enables phase comparator circuit 301. When phase comparator circuit 301 is enabled by signal B1 during calibration mode, phase comparator circuit 301 compares the phase of timing signal E9 (DQSM) to the phase of signal D8 (DQM) to generate a phase comparison signal PH1. As an example that is not intended to be limiting, phase comparator circuit 301 may be a D flip-flop circuit.

In an embodiment in which signal D8 (DQM) has a repeating test pattern of 10101010 . . . during calibration mode, phase comparator circuit 301 generates a first value in phase comparison signal PH1 in response to the phase of signal D8 (DQM) being ahead of the phase of timing signal E9 (DQSM). In this embodiment, phase comparator circuit 301 generates a second value in phase comparison signal PH1 in response to the phase of signal D8 (DQM) being behind the phase of timing signal E9 (DQSM).

Phase comparison signal PH1 is provided to an input of buffer circuit 302. Buffer circuit 302 buffers phase comparison signal PH1 to generate phase comparison signal PH2 at pin 303. Phase comparison signal PH2 is transmitted to pin 304 in transmitter circuit 201 at the input of buffer circuit 305. Signal PH2 corresponds to signal H1 in FIG. 1 in the first instance of receiver circuit 231 and to signal H2 in FIG. 1 in the second instance of receiver circuit 231. In alternative embodiments, signal H1 is transmitted through bus 131 or conductor 132, and signal H2 is transmitted through bus 133 or conductor 134. In another alternative embodiment, the logic state of phase comparison signal PH1 is stored in a register circuit in receiver circuit 231 and transmitted to transmitter circuit 201 through a shared or dedicated external conductor.

Buffer circuit 305 buffers phase comparison signal PH2 to generate phase comparison signal PH3. Phase comparison signal PH3 is provided to an input of control circuit 306. The value of phase comparison signal PH3 is equal to the corresponding value of phase comparison signal PH1.

During calibration mode, control circuit 116 enables control circuit 306. Control circuit 306 generates one or more control signals DC in response to phase comparison signal PH3 and control signal CL during calibration mode. As an example, control circuit 116 may generate periodic oscillations in control signal CL during calibration mode. Control circuit 306 may, for example, be a counter circuit that varies a count value of control signals DC based on a value of phase comparison signal PH3 in response to periodic oscillations in control signal CL. As another example, control circuit 306 includes a charge pump generating a single analog control signal DC that varies based on phase comparison signal PH3 when control circuit 306 is enabled by signal CL.

The one or more control signals DC are provided to control inputs of delay circuit 211. Delay circuit 211 has an adjustable delay tDQ-BUF3. Delay circuit 211 varies the delay tDQ-BUF3 provided to delayed timing signal E1 relative to timing signal Q1 or C1 (DQSP) based on changes in the one or more control signals DC. In an embodiment, phase comparator circuit 301 and control circuit 306 cause the delay tDQ-BUF3 of delay circuit 211 to be equal to or substantially equal to delay tDQ-BUF1 during calibration mode.

For example, control circuit 306 may increase the delay tDQ-BUF3 of delay circuit 211 in response to a value in phase comparison signal PH3 indicating the phase of signal D8 (DQM) is ahead of the phase of timing signal E9 (DQSM). In this example, control circuit 306 decreases the delay tDQ-BUF3 of delay circuit 211 in response to a value in phase comparison signal PH3 indicating the phase of signal D8 (DQM) is behind the phase of timing signal E9 (DQSM).

Calibration mode may, for example, be initiated at periodic intervals to calibrate delay tDQ-BUF3. For example, processor integrated circuit 101 may cause the system of FIG. 1 to enter calibration mode after every 10-100 milliseconds of normal mode.

Figure 4:
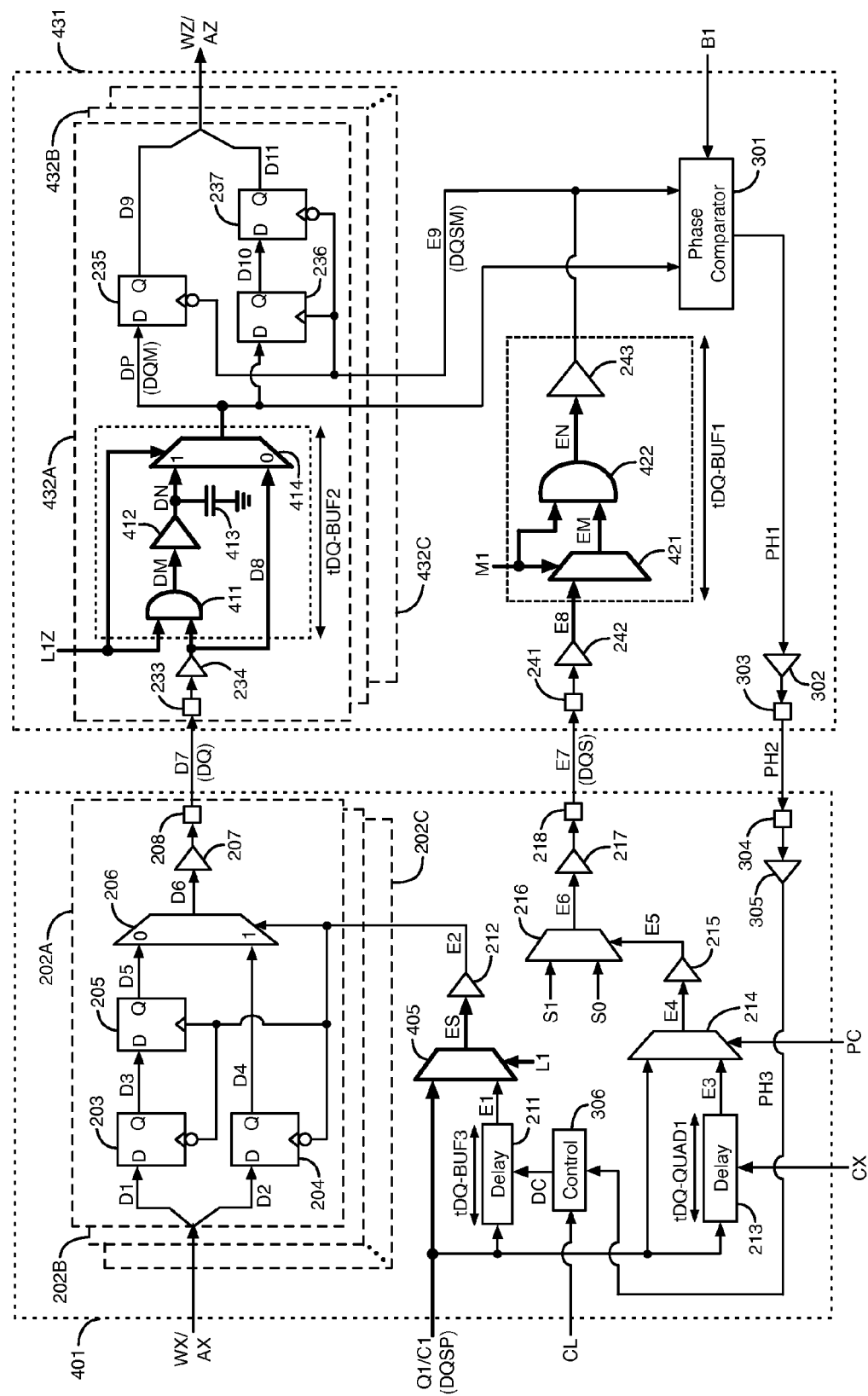
FIG. 4 illustrates another embodiment of the write data transmitter circuit and the command/address transmitter circuit of FIG. 1, and another embodiment of the write data receiver circuit and the command/address receiver circuit of FIG. 1 that includes replica circuits.

FIG. 4 illustrates an embodiment of a transmitter circuit 401 and an embodiment of a receiver circuit 431 that includes replica circuits. In an exemplary embodiment of FIG. 1, write data transmitter circuit 111 is a first instance of transmitter circuit 401, command/address transmitter circuit 113 is a second instance of transmitter circuit 401, write data receiver circuit 121 is a first instance of receiver circuit 431, and command/address receiver circuit 123 is a second instance of receiver circuit 431.

Transmitter circuit 401 includes transmitting circuits 202, delay circuits 211 and 213, control circuit 306, multiplexer circuits 214, 216, and 405, pins 218 and 304, and buffer circuits 212, 215, 217, and 305. In the embodiment of FIG. 4, transmitter circuit 401 may have any number of transmitting circuits 202, such as transmitting circuits 202A-202C.

Receiver circuit 431 includes receiving circuits 432, pins 241 and 303, multiplexer circuit 421, AND logic gate circuit 422, buffer circuits 242-243 and 302, and phase comparator circuit 301. Receiving circuits 432 include receiving circuits 432A-432C. Receiving circuit 432A includes pin 233, buffer circuit 234, D flip-flop circuits 235-237, AND logic gate circuit 411, buffer circuit 412, capacitor 413, and multiplexer circuit 414.

Receiver circuit 431 may have any number of one or more receiving circuits 432, such as receiving circuits 432A-432C. Three receiving circuits 432A-432C are shown in FIG. 4 as an example. Receiving circuits 432B-432C and the other receiving circuits 432 in receiver circuit 431 have the same circuit structure as receiving circuit 432A. Each of the receiving circuits 432 in receiver circuit 431 functions as described below with respect to receiving circuit 432A.

In the embodiment of FIG. 4, each of the receiving circuits 432 has a replica circuit that includes AND logic gate circuit 411, buffer circuit 412, and capacitor 413. Signal D8 generated by buffer circuit 234 is provided to a first input of AND logic gate circuit 411 and to the 0 multiplexing input of multiplexer circuit 414. A select signal LIZ is provided to a second input of AND logic gate circuit 411 and to a select input of multiplexer circuit 414. The circuitry and signal lines shown with thick lines in FIG. 4 indicate circuitry and signal lines that are added relative to FIG. 3A.

AND logic gate circuit 411 generates an output signal DM by performing an AND logic function using the values of signals LIZ and D8. Buffer circuit 412 buffers signal DM to generate signal DN at the 1 multiplexing input of multiplexer circuit 414. Capacitor 413 is coupled between the output of buffer circuit 412 and a node at a ground voltage. Multiplexer circuit 414 generates a selected signal DP at its output. Selected signal DP is also referred to as signal DQM with respect to FIG. 4. Selected signal DP (DQM) is provided to the D inputs of flip-flop circuits 235-236 and to an input of phase comparator circuit 301. The combined delay of the replica circuit and multiplexer circuit 414 is tDQ-BUF2.

Receiver circuit 431 also includes AND logic gate circuit 422 and multiplexer circuit 421. Timing signal E8 is provided to a first multiplexing input of multiplexer circuit 421. A signal M1 having a constant logic high state is provided to a select input of multiplexer circuit 421 and to a first input of AND logic gate circuit 422. The constant logic high state in signal M1 causes multiplexer circuit 421 to provide the value of timing signal E8 to its output in timing signal EM. Timing signal EM is provided to a second input of AND logic gate circuit 422. AND logic gate circuit 422 generates a timing signal EN by performing an AND logic function using the values of signals EM and M1. Because signal M1 has a constant logic high state, AND logic gate circuit 422 causes timing signal EN to have the same logic state as timing signal EM. Buffer circuit 243 buffers timing signal EN to generate timing signal E9 (DQSM) in the embodiment of FIG. 4.

Transmitter circuit 401 includes an additional multiplexer circuit 405. Timing signal Q1 or C1 (DQSP) is provided to a first multiplexing input of multiplexer circuit 405 in the respective first and second instances of transmitter circuit 401. The delayed timing signal E1 generated by delay circuit 211 is provided to the second multiplexing input of multiplexer circuit 405. A select signal L1 is provided to a select input of multiplexer circuit 405. Multiplexer circuit 405 generates a timing signal ES at its output. Buffer circuit 212 buffers timing signal ES to generate timing signal E2 in the embodiment of FIG. 4. Select signal L1 may, for example, be generated by control circuit 116, stored in a register, transmitted to memory integrated circuit 130, and used to generate select signal L1Z. As another example, each of select signals L1 and L1Z is generated based on a signal provided from a pin and stored in a register.

Transmitter circuit 401 and receiver circuit 431 are configurable to operate in normal mode and in calibration mode. During normal and calibration modes, each of the receiving circuits 432 provides the information in signal D8 through a circuit path that bypasses the replica circuit. During normal and calibration modes, signal LIZ has a logic low state that causes multiplexer circuit 414 to provide the value of signal D8 to its output in selected signal DP (DQM). Flip-flop circuits 235 and 236 store the value of selected signal DP (DQM) at their Q outputs in signals D9 and D10 in response to falling and rising edges of timing signal E9 (DQSM), respectively.

Signal L1 has a logic state during normal and calibration modes that causes multiplexer circuit 405 to provide the value of delayed timing signal E1 to its output in timing signal ES. Phase comparator circuit 301 compares timing signal E9 (DQSM) to selected signal DP (DQM) in calibration mode. Control circuit 306 causes the delay of delay circuit 211 to match the combined delay of buffer circuit 242, multiplexer circuit 421, AND logic gate circuit 422, and buffer circuit 243 during calibration mode.

Transmitter circuit 401 and receiver circuit 431 are also configurable to operate in a replica mode. During replica mode, signal L1Z has a logic high state. When signal H1 has a logic high state, AND logic gate circuit 411 causes signal DM to have the same logic state as signal D8, and multiplexer circuit 414 provides the value of signal DN to its output in selected signal DP (DQM). Select signal PC has a logic state in replica mode that causes multiplexer circuit 214 to provide the value of delayed timing signal E3 to its output in timing signal E4. Signal B1 disables phase comparator circuit 301 in replica mode.

Signal L1 has a logic state during replica mode that causes multiplexer circuit 405 to provide the value of timing signal Q1 or C1 (DQSP) to its output in timing signal ES. Because selected signal DP (DQM) is delayed by the replica circuit during replica mode, multiplexer circuit 405 causes signal Q1 or C1 (DQSP) to bypass delay circuit 211. The delay tDQ-BUF2 provided to signal DP (DQM) by AND logic gate circuit 411, buffer circuit 412, capacitor 413, and multiplexer circuit 414 matches the delay tDQ-BUF1 provided to timing signal E9 (DQSM) by multiplexer circuit 421, AND logic gate circuit 422, and buffer circuit 243. Capacitor 413 has the same capacitance as the output capacitance of buffer circuit 243. In replica mode, the rising and falling edges of timing signal E9 (DQSM) are at or near the centers of the bit periods of signal DP (DQM).

Figure 5A:
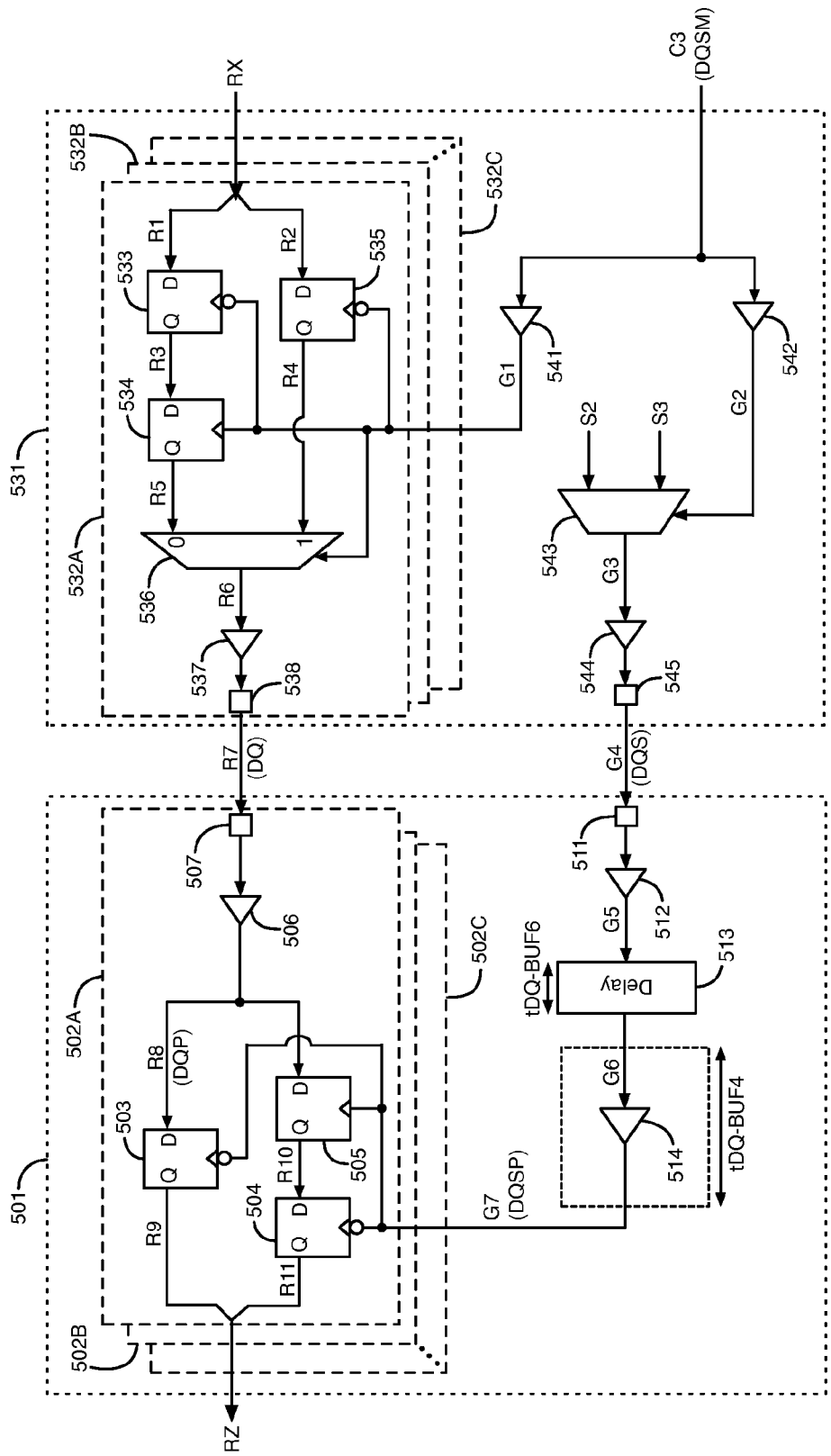
FIG. 5A illustrates an embodiment of the read data transmitter circuit of FIG. 1 and an embodiment of the read data receiver circuit of FIG. 1.

FIG. 5A illustrates an embodiment of a transmitter circuit 531 and an embodiment of a receiver circuit 501. In an exemplary embodiment of FIG. 1, transmitter circuit 531 is an embodiment of read data transmitter circuit 122, and receiver circuit 501 is an embodiment of read data receiver circuit 112.

Transmitter circuit 531 includes transmitter circuits 532, buffer circuits 541-542, multiplexer circuit 543, buffer circuit 544, and pin 545. Transmitting circuits 532 include transmitting circuits 532A-532C. Transmitting circuit 532A includes D flip-flop circuits 533-535, multiplexer circuit 536, buffer circuit 537, and pin 538. Each of flip-flop circuits 533-535 is a storage circuit. Pins 538 and 545 are external terminals of memory integrated circuit 130. Buffer circuits 537 and 544 are interface circuits that provide signals to pins 538 and 545, respectively.

In the embodiment of FIG. 5A, transmitter circuit 531 may have any number of one or more transmitting circuits 532, such as transmitting circuits 532A-532C. Three transmitting circuits 532A-532C are shown in FIG. 5A as an example. Transmitting circuits 532B-532C and the other transmitting circuits 532 in transmitter circuit 531 have the same circuit structure as transmitting circuit 532A. Each of the transmitting circuits 532 in transmitter circuit 531 functions as described below with respect to transmitting circuit 532A.

Receiver circuit 501 includes receiving circuits 502, pin 511, buffer circuit 512, delay circuit 513, and buffer circuit 514. Receiving circuits 502 include receiving circuits 502A-502C. Receiving circuit 502A includes D flip-flop circuits 503-505, buffer circuit 506, and pin 507. Each of flip-flop circuits 503-505 is a storage circuit. Pins 507 and 511 are external terminals of processor integrated circuit 101. Buffer circuits 506 and 512 are interface circuits that receive signals from pins 507 and 511, respectively.

Receiver circuit 501 may have any number of one or more receiving circuits 502, such as receiving circuits 502A-502C. Three receiving circuits 502A-502C are shown in FIG. 5A as an example. Receiving circuits 502B-502C and the other receiving circuits 502 in receiver circuit 501 have the same circuit structure as receiving circuit 502A. Each of the receiving circuits 502 in receiver circuit 501 functions as described below with respect to receiving circuit 502A.

During each read operation, processor circuit 115 provides signals AX that indicate a read command and an address to command/address transmitter circuit 113. Command/address receiver circuit 123 generates signals AZ that indicate the read command and the address, as described above with respect to FIG. 1. Memory circuit 125 accesses read data stored in one or more memory locations identified by the address in response to the read command. Memory circuit 125 provides signals RX that indicate the read data to read data transmitter circuit 122 in normal mode.

A description is now provided for receiver circuit 501 and transmitter circuit 531 during normal mode. Referring to FIG. 5A, two of signals RX are provided to each of the transmitting circuits 532 in normal mode. Signals R1 and R2 are provided to transmitting circuit 532A. Signals R1 and R2 are a subset of signals RX during read operations in normal mode. Signals R1 and R2 are provided to the D inputs of flip-flop circuits 533 and 535, respectively, in transmitting circuit 532A.

Timing signal C3 is provided to the inputs of buffer circuits 541-542. Timing signal C3 is also referred to as signal DQSM in the present disclosure with respect to FIGS. 5A-9C and 12A-12B. In an embodiment, timing signal C3 (DQSM) is timing signal E9 (DQSM) generated by the second instance of receiver circuit 231 or 431. Buffer circuit 541 buffers timing signal C3 (DQSM) to generate timing signal G1. Timing signal G1 is provided to a select input of multiplexer circuit 536, to the clock input of flop-flop circuit 534, and to the inverting clock inputs of flip-flop circuits 533 and 535 in each of transmitting circuits 532.

Buffer circuit 542 buffers timing signal C3 (DQSM) to generate timing signal G2. Timing signal G2 is provided to a select input of multiplexer circuit 543. Signals S2 and S3 are provided to multiplexing inputs of multiplexer circuit 543. During the normal and calibration modes, signal S3 has a value that indicates a logic high state, and signal S2 has a value that indicates a logic low state. For example, signal S3 may be generated from a supply voltage, and signal S2 may be generated from a ground voltage. Multiplexer circuit 543 provides the value of signal S3 to its output in timing signal G3 in odd numbered periods of timing signal G2. Multiplexer circuit 543 provides the value of signal S2 to its output in timing signal G3 in even numbered periods of timing signal G2. As a result, timing signal G3 has a period and a duty cycle that matches the period and duty cycle of timing signal G2.

Buffer circuit 544 buffers timing signal G3 to generate a timing signal G4 at pin 545. Timing signal G4 is also referred to as timing signal DQS in the present disclosure with respect to FIGS. 5A-9C and 12A-12B. Timing signal G4 (DQS) is transmitted to pin 511 at the input of buffer circuit 512 in receiver circuit 501. Buffer circuit 512 buffers timing signal G4 (DQS) to generate timing signal G5. Timing signal G5 is provided to an input of delay circuit 513.

Delay circuit 513 delays timing signal G5 by a delay tDQ-BUF6 to generate a delayed timing signal G6. Delayed timing signal G6 is provided to an input of buffer circuit 514. In an embodiment, buffer circuit 514 includes a chain of buffer circuits that are coupled together in series. The chain of buffer circuits in buffer circuit 514 may, as an example, be an exponentially scaled buffer chain. Buffer circuit 514 buffers delayed timing signal G6 by a delay tDQ-BUF4 to generate timing signal G7. Timing signal G7 is also referred to as timing signal DQSP in the present disclosure with respect to FIGS. 5A-9C and 12A-12B. Timing signal G7 (DQSP) is provided to the clock input of flip-flop circuit 505 and to the inverting clock inputs of flip-flop circuits 503-504.

During each read operation, flip-flop circuits 533 and 535 store the values of signals R1 and R2 at their Q outputs in signals R3 and R4, respectively, in response to each falling edge in timing signal G1. Flip-flop circuit 534 stores the value of signal R3 at its Q output in signal R5 in response to each rising edge in timing signal G1. Signal R4 is provided to the 1 multiplexing input of multiplexer circuit 536, and signal R5 is provided to the 0 multiplexing input of multiplexer circuit 536.

Multiplexer circuit 536 provides the value of signal R4 to its output in signal R6 during each logic high state in timing signal G1. Multiplexer circuit 536 provides the value of signal R5 to its output in signal R6 during each logic low state in timing signal G1. The delay that multiplexer circuit 543 provides to timing signal G3 matches the delay that multiplexer circuit 536 provides to signal R6. Signal R6 is provided to an input of buffer circuit 537.

Buffer circuit 537 buffers signal R6 to generate signal R7 at pin 538. Signal R7 is also referred to as signal DQ in the present disclosure with respect to FIGS. 5A-9C and 12A-12B. Signal R7 (DQ) is transmitted to pin 507 at the input of buffer circuit 506 in receiver circuit 502A. Signal R7 (DQ) corresponds to one of signals RY in FIG. 1 during normal mode. Buffer circuit 506 buffers signal R7 (DQ) to generate signal R8. Signal R8 is also referred to as signal DQP in the present disclosure with respect to FIGS. 5A-6B. Signal R8 (DQP) is provided to the D inputs of flip-flop circuits 503 and 505.

Flip-flop circuit 503 stores the value of signal R8 (DQP) at its Q output in signal R9 in response to each falling edge in timing signal G7 (DQSP). Flip-flop circuit 505 stores the value of signal R8 (DQP) at its Q output in signal R10 in response to each rising edge in timing signal G7 (DQSP). Flip-flop circuit 504 stores the value of signal R10 at its Q output in signal R11 in response to each falling edge in timing signal G7 (DQSP). Each of receiving circuits 502 generates a set of signals R9 and R11. The signals R9 and R11 generated by receiving circuits 502 are collectively provided as signals RZ at outputs of receiver circuit 501. Signals RZ indicate the read data for a read operation.

Figure 5B:
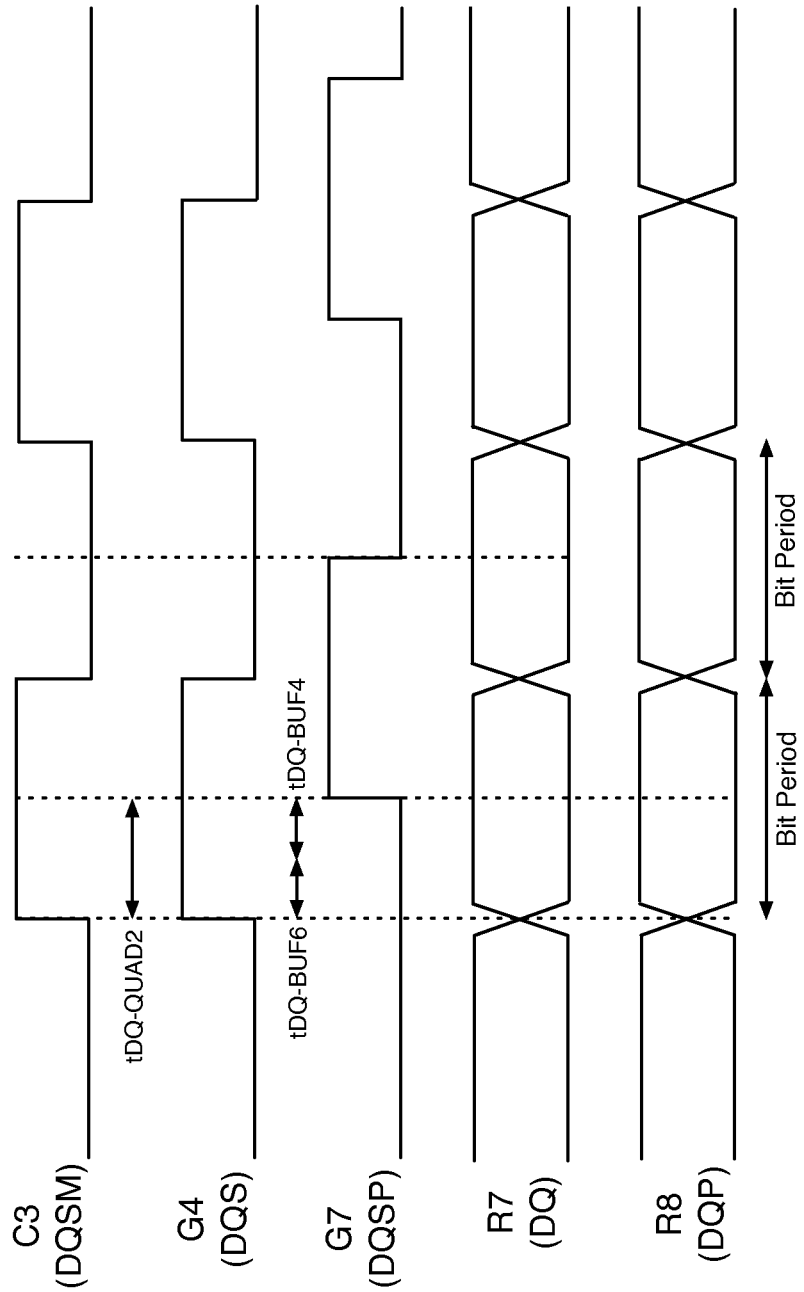
FIG. 5B is a timing diagram showing exemplary waveforms of a subset of the signals shown in FIG. 5A.

FIG. 5B is a timing diagram showing exemplary waveforms of a subset of the signals shown in FIG. 5A. The timing diagram of FIG. 5B illustrates exemplary waveforms for timing signal C3 (DQSM), timing signal G4 (DQS), timing signal G7 (DQSP), signal R7 (DQ), and signal R8 (DQP) during normal mode. The exemplary waveforms of FIG. 5B are generated in a double data rate embodiment of FIG. 5A.

In the embodiment of FIG. 5B, the combined delay of buffer circuit 542, multiplexer circuit 543, and buffer circuit 544 is small. Thus, the rising and falling edges of timing signal G4 (DQS) are approximately aligned with corresponding rising and falling edges of timing signal C3 (DQSM), as shown in FIG. 5B. The transitions in signal R7 (DQ) are aligned with the rising and falling edges of timing signal G4 (DQS), because the delays of buffer circuit 542, multiplexer circuit 543, and buffer circuit 544 match the delays of buffer circuit 541, multiplexer circuit 536, and buffer circuit 537, respectively.

In an embodiment, the delays of buffer circuits 506 and 512 are small. Delay circuit 513 and buffer circuit 514 delay timing signal G7 (DQSP) relative to timing signal G4 (DQS), as shown in FIG. 5B. Delay circuit 513 and buffer circuit 514 delay timing signal G7 (DQSP) to cause the rising and falling edges of timing signal G7 (DQSP) to occur at or near the centers of the bit periods of signal R8 (DQP), as shown in FIG. 5B, allowing flip-flop circuits 503 and 505 to capture the values of signal R8 (DQP).

Each of the receiving circuits 502 lacks a replica circuit coupled between buffer circuit 506 and flip-flop circuits 503 and 505 that replicates the delays of delay circuit 513 and buffer circuit 514. Receiver circuit 501 consumes less power than a receiver circuit having a replica circuit in each of the receiving circuits.

Variations in the processes, the temperatures, and the supply voltages of integrated circuits 101 and 130 may cause the combined delay of delay circuit 513 and buffer circuit 514 to be greater than or less than one-half of the bit period of signal R8 (DQP). In an embodiment shown in and described below with respect to FIGS. 6A-6B, delay circuit 513 has an adjustable delay tDQ-BUF6 that is calibrated during the calibration mode to cause the combined delay of delay circuit 513 and buffer circuit 514 to equal one-half of the bit period of signal R8 (DQP). In an embodiment, the delay tDQ-BUF4 of buffer circuit 514 is fixed and non-adjustable.

Figure 6A:
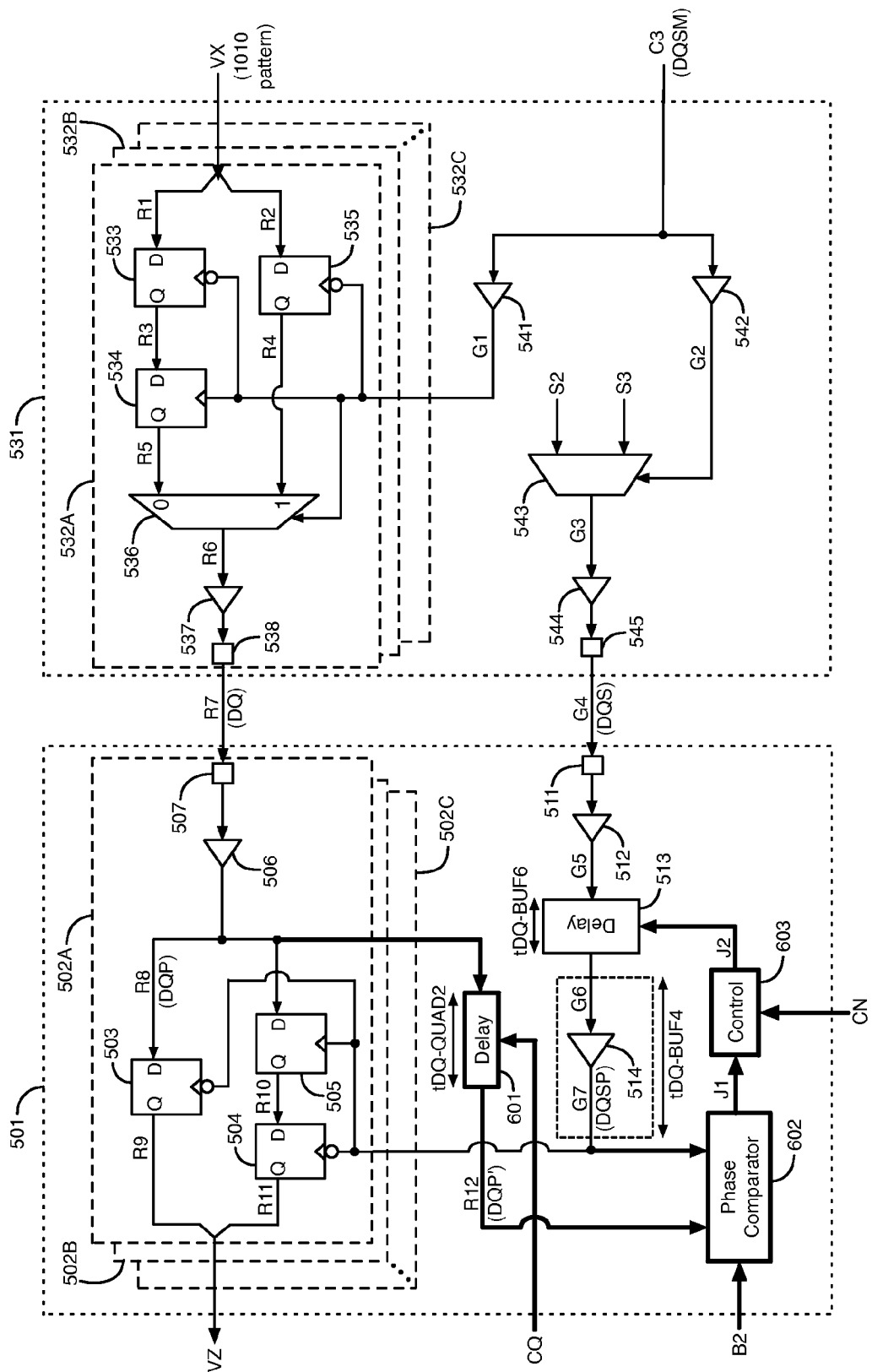
FIG. 6A illustrates additional portions of the read data receiver circuit of FIG. 5A that are used to calibrate the delay provided to a timing signal in the read data receiver circuit during a calibration mode.

FIG. 6A illustrates additional circuitry in receiver circuit 501 that is used to calibrate the delay tDQ-BUF6 of delay circuit 513 during calibration mode. In the embodiment of FIG. 6A, receiver circuit 501 includes delay circuit 601, phase comparator circuit 602, and control circuit 603. FIG. 6A also shows transmitter circuit 531. The circuitry and signal lines shown with thick lines in FIG. 6A indicate circuitry and signal lines that are not shown in FIG. 5A.

During calibration mode, control circuit 126 generates test signals VX based on test signals UZ, as described above with respect to FIG. 1. Test signals VX and timing signal C3 (DQSM) are provided to transmitter circuit 531 (i.e., an example of read data transmitter circuit 122). Two of signals VX are provided to each of the transmitting circuits 532 in transmitter circuit 531. Signals R1 and R2 are a subset of signals VX during calibration mode. Signals R1 and R2 are provided to the D inputs of flip-flop circuits 533 and 535, respectively, as described above. Signal R7 (DQ) generated by transmitter circuit 531 corresponds to one of signals VY in FIG. 1 during calibration mode. Signal R7 (DQ) has a test pattern that may be, for example, a repeating pattern of logic high and low states (i.e., 1010 . . . ) in calibration mode.

Figure 6B:
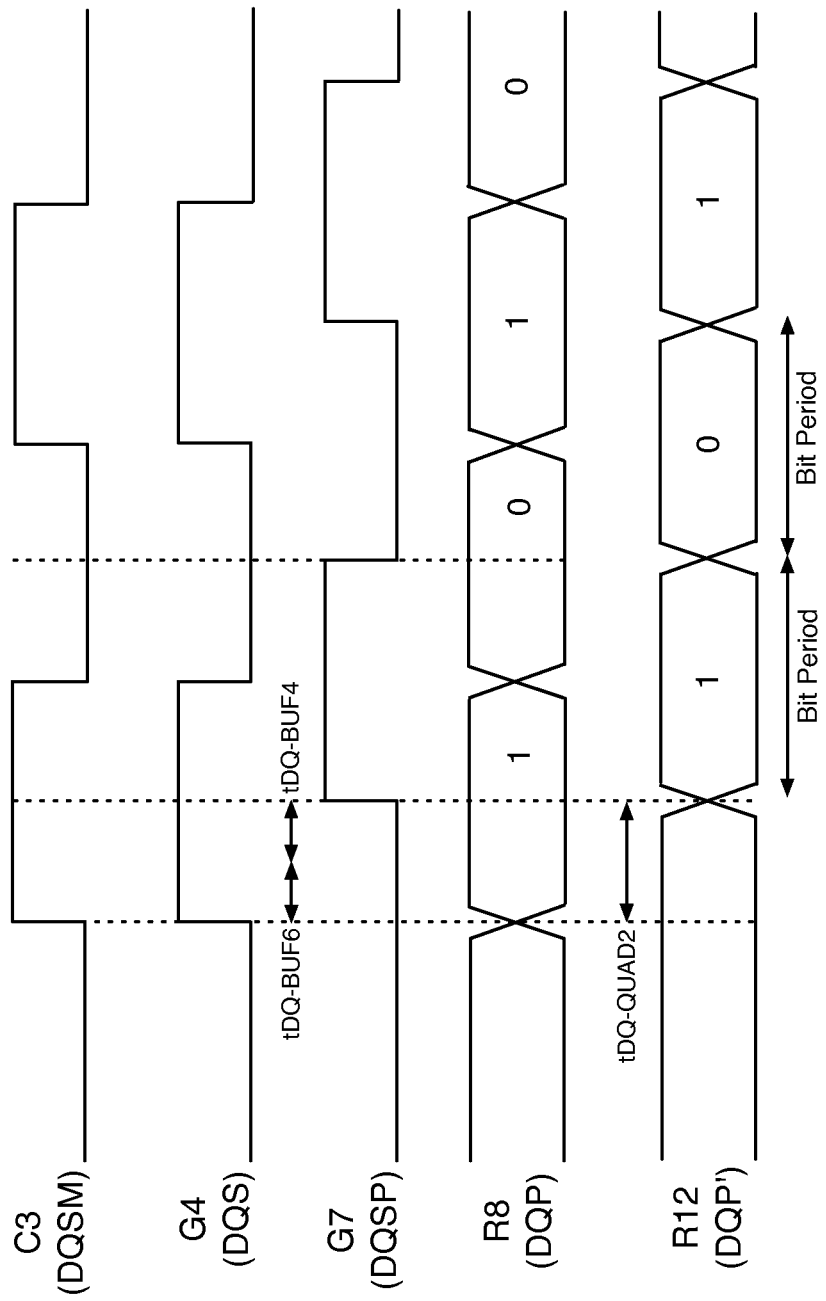
FIG. 6B is a timing diagram showing exemplary waveforms of a subset of the signals shown in FIG. 6A.

FIG. 6B is a timing diagram showing exemplary waveforms of a subset of the signals shown in FIG. 6A. The timing diagram of FIG. 6B illustrates exemplary waveforms for timing signal C3 (DQSM), timing signal G4 (DQS), timing signal G7 (DQSP), signal R8 (DQP), and signal R12 (DQP') during calibration mode. The exemplary waveforms of FIG. 6B are generated in a double data rate embodiment of FIG. 6A.

Signal R8 (DQP) has a repeating test pattern of 10101010 . . . during calibration mode as shown in FIG. 6B. Delay circuit 601 in receiver circuit 501 delays signal R8 (DQP) by a delay tDQ-QUAD2 to generate a delayed signal R12, as shown in FIG. 6B. In some embodiments, delay tDQ-QUAD2 equals one-half the bit period of signal R8 (DQP). For example, in a double data rate embodiment of FIG. 6A, delay tDQ-QUAD2 is a quadrature delay that equals one-quarter of the period of timing signal G4 (DQS). Delayed signal R12 is also referred to as signal DQP' in the present disclosure. Delayed signal R12 (DQP') also has a repeating test pattern of 10101010 . . . as shown in FIG. 6B.

Control signals CQ are provided to control inputs of delay circuit 601. The delay tDQ-QUAD2 of delay circuit 601 is adjustable. The delay tDQ-QUAD2 of delay circuit 601 varies based on changes in control signals CQ. In an embodiment, control signals CQ cause the delay tDQ-QUAD2 of delay circuit 601 to equal one-half the bit period of signal R8 (DQP). An example of delay circuit 601 is shown in and described with respect to FIG. 7 and its related figures in U.S. provisional patent application 61/487,221, referenced above.

Control signal B2 is provided to an input of phase comparator circuit 602. During normal mode, control circuit 116 generates a value in control signal B2 that disables phase comparator circuit 602. During calibration mode, control circuit 116 generates a value in control signal B2 that enables phase comparator circuit 602.

Timing signal G7 (DQSP) and delayed signal R12 (DQP') are provided to inputs of phase comparator circuit 602. When phase comparator circuit 602 is enabled by control signal B2 during calibration mode, phase comparator circuit 602 compares the phase of timing signal G7 (DQSP) to the phase of delayed signal R12 (DQP') to generate a phase comparison signal J1. Phase comparison signal J1 indicates if the phase of timing signal G7 (DQSP) is aligned with the phase of delayed signal R12 (DQP'). As an example that is not intended to be limiting, phase comparator circuit 602 may be a D flip-flop circuit.

In an embodiment in which signal R12 (DQP') has a repeating test pattern of 10101010 . . . during calibration mode, phase comparator circuit 602 generates a first value in phase comparison signal J1 in response to the phase of signal R12 (DQP') being ahead of the phase of timing signal G7 (DQSP). In this embodiment, phase comparator circuit 602 generates a second value in phase comparison signal J1 in response to the phase of signal R12 (DQP') being behind the phase of timing signal G7 (DQSP).

Phase comparison signal J1 is provided to an input of control circuit 603. Control signal CN is provided to another input of control circuit 603. During calibration mode, control circuit 116 enables control circuit 603 using control signal CN. Control circuit 603 generates one or more control signals J2 based on phase comparison signal J1 and control signal CN during calibration mode.

For example, control circuit 603 may include a counter circuit that varies a count value of control signals J2 based on a value of phase comparison signal J1 when control circuit 603 is enabled by control signal CN. As another example, control circuit 603 may include a charge pump that generates a single analog control signal J2. Control circuit 603 varies the single analog control signal J2 based on phase comparison signal J1 when control circuit 603 is enabled by control signal CN.

The one or more control signals J2 are provided to control inputs of delay circuit 513. Delay circuit 513 varies the delay tDQ-BUF6 provided to delayed timing signal G6 relative to timing signal G5 based on changes in the one or more control signals J2. During calibration mode, phase comparator circuit 602 and control circuit 603 cause the delay tDQ-BUF6 of delay circuit 513 to equal or substantially equal the delay tDQ-QUAD2 of delay circuit 601 minus the delay tDQ-BUF4 of buffer circuit 514.

For example, control circuit 603 may decrease the delay tDQ-BUF6 of delay circuit 513 in response to a value in phase comparison signal J1 indicating the phase of signal R12 (DQP') is ahead of the phase of timing signal G7 (DQSP). In this example, control circuit 603 increases the delay tDQ-BUF6 of delay circuit 513 in response to a value in phase comparison signal J1 indicating the phase of signal R12 (DQP') is behind the phase of timing signal G7 (DQSP). The calibration mode may, for example, be initiated at periodic intervals to calibrate delay tDQ-BUF6.

Figure 7:
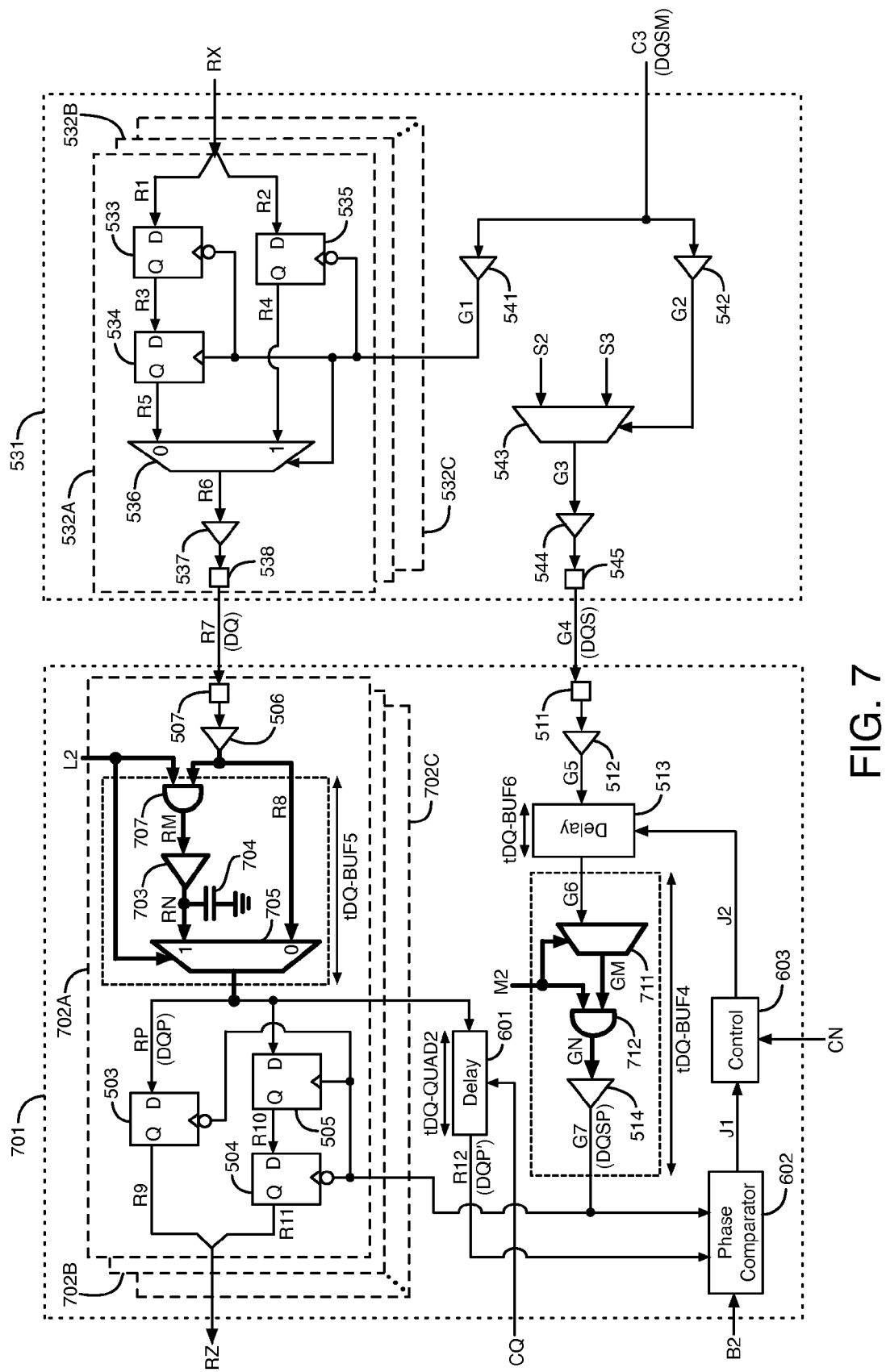
FIG. 7 illustrates an embodiment of the read data receiver circuit of FIG. 1 that includes replica circuits.

FIG. 7 illustrates an embodiment of a receiver circuit 701 that includes a replica circuit in each of the receiving circuits. FIG. 7 also illustrates transmitter circuit 531. In an exemplary embodiment of FIG. 1, transmitter circuit 531 is an embodiment of read data transmitter circuit 122, and receiver circuit 701 is an embodiment of read data receiver circuit 112.

Receiver circuit 701 includes receiving circuits 702, pin 511, buffer circuit 512, delay circuit 513, multiplexer circuit 711, AND logic gate circuit 712, buffer circuit 514, delay circuit 601, phase comparator circuit 602, and control circuit 603. Receiving circuits 702 include receiving circuits 702A-702C. Receiving circuit 702A includes D flip-flop circuits 503-505, buffer circuit 506, pin 507, AND logic gate circuit 707, buffer circuit 703, capacitor 704, and multiplexer circuit 705. The circuitry and signal lines shown with thick lines in FIG. 7 indicate circuitry and signal lines that are added relative to FIG. 6A.

Receiver circuit 701 may have any number of one or more receiving circuits 702, such as receiving circuits 702A-702C. Three receiving circuits 702A-702C are shown in FIG. 7 as an example. Receiving circuits 702B-702C and the other receiving circuits 702 in receiver circuit 701 have the same circuit structure as receiving circuit 702A. Each of the receiving circuits 702 in receiver circuit 701 functions as described below with respect to receiving circuit 702A.

In the embodiment of FIG. 7, receiver circuit 701 receives signals R7 (DQ) and G4 (DQS) at pins 507 and 511, respectively, from transmitter circuit 531 during a read operation and during calibration mode. The signal R8 generated by buffer circuit 506 is provided to a first input of AND logic gate circuit 707 and to the 0 multiplexing input of multiplexer circuit 705 in receiver circuit 701. A select signal L2 is provided to a second input of AND logic gate circuit 707 and to a select input of multiplexer circuit 705. Select signal L2 may, for example, be generated by control circuit 116. As another example, select signal L2 may be generated based on a signal provided from a pin and stored in a register.

AND logic gate circuit 707 generates an output signal RM by performing an AND logic function using the values of signals L2 and R8. Buffer circuit 703 buffers signal RM to generate a buffered signal RN that is provided to the 1 multiplexing input of multiplexer circuit 705. Capacitor 704 is coupled between the output of buffer circuit 703 and a node at a ground voltage. Multiplexer circuit 705 generates a selected signal RP at its output. Selected signal RP is also referred to as signal DQP with respect to FIGS. 7 and 12A-12B. Selected signal RP (DQP) is provided to the D inputs of flip-flop circuits 503 and 505 and to an input of delay circuit 601. In the embodiment of FIG. 7, delay circuit 601 delays signal RP (DQP) to generate delayed signal R12 (DQP').

The delayed timing signal G6 generated by delay circuit 513 is provided to a multiplexing input of multiplexer circuit 711. A signal M2 having a constant logic high state is provided to a select input of multiplexer circuit 711 and to a first input of AND logic gate circuit 712. The constant logic high state in signal M2 causes multiplexer circuit 711 to provide the value of timing signal G6 to its output in timing signal GM. Timing signal GM is provided to a second input of AND logic gate circuit 712. AND logic gate circuit 712 generates a timing signal GN by performing an AND logic function using the values of signals M2 and GM. Because signal M2 has a constant logic high state, AND logic gate circuit 712 causes timing signal GN to have the same logic state as timing signal GM. Buffer circuit 514 buffers timing signal GN to generate timing signal G7 (DQSP) in the embodiment of FIG. 7. In receiver circuit 701, flip-flop circuits 503 and 505 store the value of signal RP (DQP) at their Q outputs in response to falling and rising edges of timing signal G7 (DQSP), respectively.

Transmitter circuit 531 and receiver circuit 701 are configurable to operate in normal and calibration modes. Each of the receiving circuits 702 in receiver circuit 701 has a replica circuit that includes AND logic gate circuit 707, buffer circuit 703, and capacitor 704. During normal and calibration modes, each of the receiving circuits 702 provides the information in signal R8 through a circuit path that bypasses the replica circuit. During normal and calibration modes, signal L2 has a logic low state that causes multiplexer circuit 705 to provide the value of signal R8 to its output in selected signal RP (DQP). In calibration mode, phase comparator circuit 602 and control circuit 603 cause the delay of delay circuit 513 to equal the delay tDQ-QUAD2 of delay circuit 601 minus the delays AND logic gate circuit 712 and buffer circuit 514.

Receiver circuit 701 is also configurable to operate in replica mode. During replica mode, signal L2 has a logic high state. When signal L2 has a logic high state, AND logic gate circuit 707 causes signal RM to have the same logic state as signal R8, and multiplexer circuit 705 provides the value of signal RN to its output in signal RP (DQP). Thus, signal RP (DQP) is delayed by the replica circuit in replica mode. The replica circuit and multiplexer circuit 705 provide a delay tDQ-BUF5 to signal RP (DQP) in replica mode relative to signal R7 (DQ). The delay tDQ-BUF5 provided to signal RP (DQP) by AND logic gate circuit 707, buffer circuit 703, capacitor 704, and multiplexer circuit 705 matches the delay tDQ-BUF4 provided to timing signal G7 (DQSP) by AND logic gate circuit 712, buffer circuit 514, and multiplexer circuit 711. Capacitor 704 has the same capacitance as the output capacitance of buffer circuit 514.

During replica mode, receiver circuit 701 receives read data in signal R7 (DQ) from transmitter circuit 531 during read operations. In an embodiment, receiver circuit 701 periodically switches between replica mode and calibration mode. During a calibration mode following a replica mode, phase comparator circuit 602 and control circuit 603 cause the delay of delay circuit 513 to equal the delay tDQ-QUAD2 of delay circuit 601.

Figure 8A:
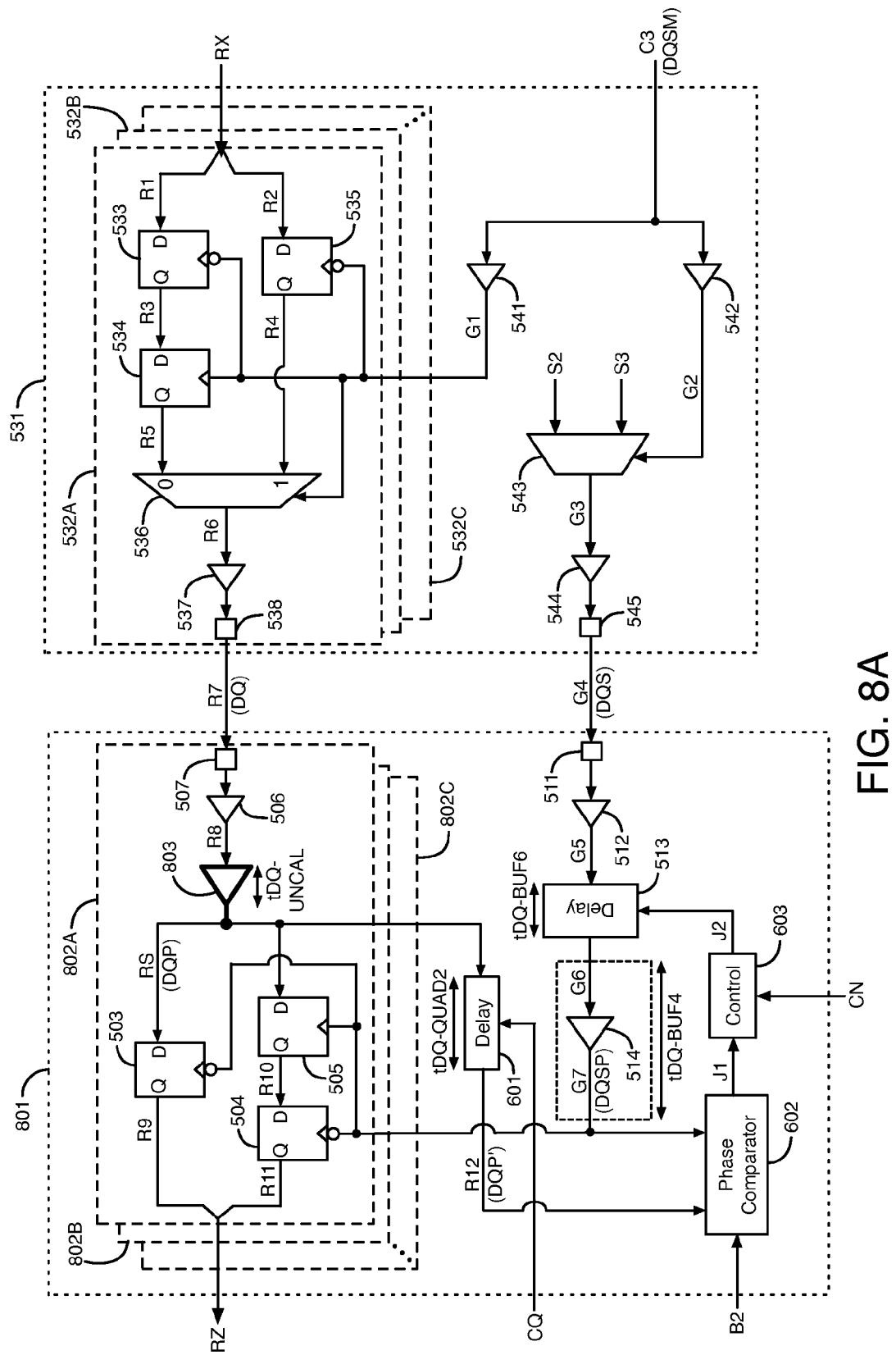
FIG. 8A illustrates an embodiment of the read data receiver circuit of FIG. 1 that includes additional buffer circuits in the read data path.

FIG. 8A illustrates an embodiment of a receiver circuit 801 that includes an additional buffer circuit in each of the receiving circuits in the read data path. FIG. 8A also illustrates transmitter circuit 531. In an exemplary embodiment of FIG. 1, transmitter circuit 531 is an embodiment of read data transmitter circuit 122, and receiver circuit 801 is an embodiment of read data receiver circuit 112.

Receiver circuit 801 includes receiving circuits 802, pin 511, buffer circuit 512, delay circuit 513, buffer circuit 514, delay circuit 601, phase comparator circuit 602, and control circuit 603. Receiving circuits 802 include receiving circuits 802A-802C. Receiving circuit 802A includes D flip-flop circuits 503-505, buffer circuit 506, pin 507, and buffer circuit 803. Buffer circuit 803 is shown with thick lines in FIG. 8A to indicate that it has been added relative to the embodiment of FIG. 6A.

Receiver circuit 801 may have any number of one or more receiving circuits 802, such as receiving circuits 802A-802C. Three receiving circuits 802A-802C are shown in FIG. 8A as an example. Receiving circuits 802B-802C and the other receiving circuits 802 in receiver circuit 801 have the same circuit structure as receiving circuit 802A. Each of the receiving circuits 802 in receiver circuit 801 functions as described below with respect to receiving circuit 802A.

In the embodiment of FIG. 8A, the minimum delay tDQ-BUF6(MIN) of delay circuit 513 plus the maximum delay tDQ-BUF4(MAX) of buffer circuit 514 is greater than tDQ-QUAD2 (i.e., tDQ-BUF6(MIN)+tDQ-BUF4(MAX)>tDQ-QUAD2). The delay of buffer circuit 514 may vary, for example, in response to changes in the process, the temperature, and a supply voltage in processor integrated circuit 101. Without additional delays in the read data paths, the rising and falling edges of timing signal G7 (DQSP) occur after the centers of the bit periods of signal R8 when buffer circuit 514 has its maximum delay. In receiver circuit 801, an additional buffer circuit 803 is coupled between buffer circuit 506 and flip-flop circuits 503 and 505 in each of receiving circuits 802 to delay signal R8. The delay tDQ-UNCAL of the additional buffer circuit 803 may, for example, be greater than or equal to tDQ-BUF6(MIN)+tDQ-BUF4(MAX)−tDQ-QUAD2. In an embodiment, buffer circuit 803 includes a chain of buffer circuits that are coupled together in series. Buffer circuit 803 may have a fixed delay or an adjustable delay.

Receiver circuit 801 receives signals R7 (DQ) and G4 (DQS) at pins 507 and 511, respectively, from transmitter circuit 531 during a read operation and during calibration mode. The signal R8 generated by buffer circuit 506 is provided to an input of buffer circuit 803. Buffer circuit 803 buffers signal R8 to generate a signal RS. Signal RS is also referred to as signal DQP in the present disclosure with respect to FIGS. 8A-8C. Buffer circuit 803 provides a delay of tDQ-UNCAL to signal RS (DQP) relative to signal R8. Signal RS (DQP) is provided to the D inputs of flip-flop circuits 503 and 505 and to an input of delay circuit 601. In the embodiment of FIG. 8A, delay circuit 601 delays signal RS (DQP) to generate delayed signal R12 (DQP'). Flip-flop circuits 503 and 505 store the value of signal RS (DQP) at their Q outputs in signals R9 and R10 in response to falling and rising edges of timing signal G7 (DQSP), respectively.

Figure 8B:
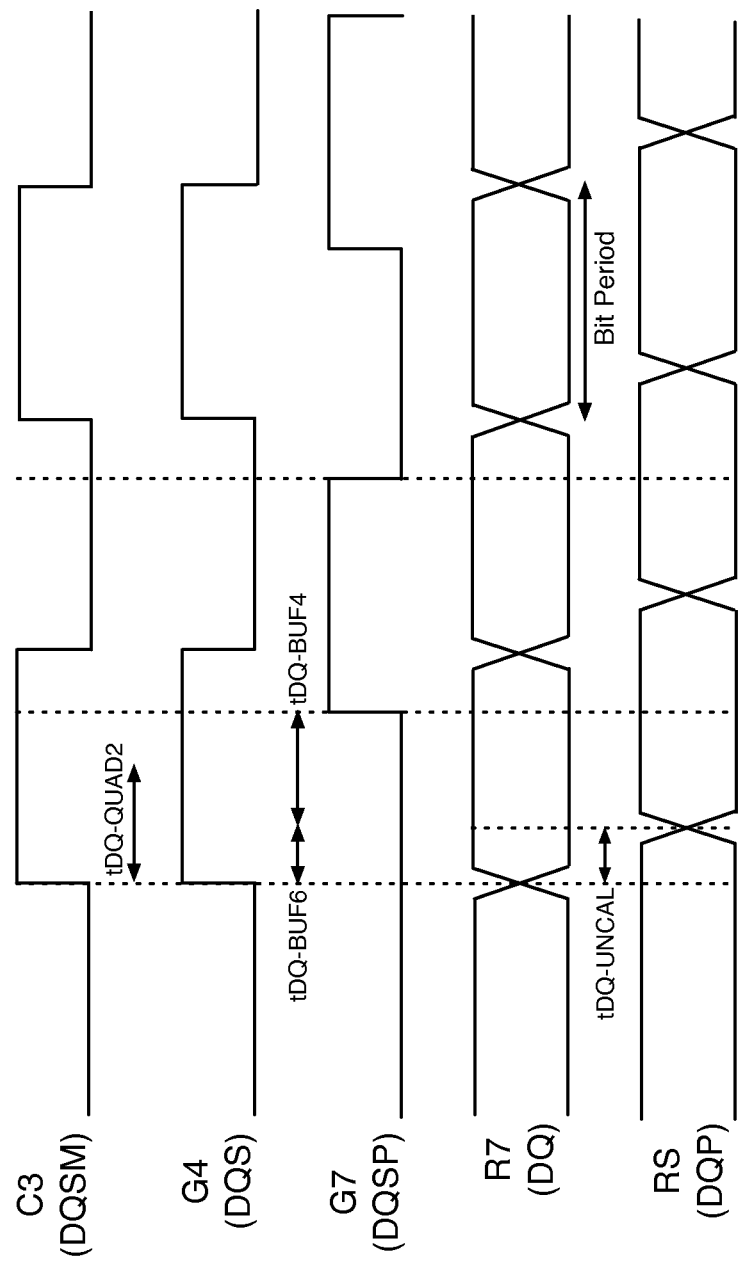
FIG. 8B is a timing diagram showing exemplary waveforms of a subset of the signals shown in FIG. 8A during normal mode.

FIG. 8B is a timing diagram showing exemplary waveforms of a subset of the signals shown in FIG. 8A during normal mode. The timing diagram of FIG. 8B illustrates exemplary waveforms for timing signal C3 (DQSM), timing signal G4 (DQS), timing signal G7 (DQSP), signal R7 (DQ), and signal RS (DQP). The exemplary waveforms of FIG. 8B are generated in a double data rate embodiment of FIG. 8A.

Delay circuit 513 delays timing signal G5 by a delay tDQ-BUF6 to generate timing signal G6. Buffer circuit 514 delays timing signal G6 by a delay tDQ-BUF4 to generate timing signal G7 (DQSP). As shown in FIG. 8B, timing signal G7 (DQSP) has a delay equal to tDQ-BUF6+tDQ-BUF4 relative to timing signal G4 (DQS). In the embodiment of FIG. 8B, the delay of buffer circuit 512 is negligible compared to delays tDQ-BUF6 and tDQ-BUF4.

The delay of buffer circuit 506 is negligible compared to the delay tDQ-UNCAL of buffer circuit 803. Signal RS (DQP) has a delay equal to tDQ-UNCAL relative to signal R7 (DQ). Delay circuit 601 delays signal RS (DQP) by a delay tDQ-QUAD2 to generate signal R12 (DQP'). In an embodiment, delay tDQ-QUAD2 equals one-half the bit period of signal RS (DQP). The embodiment of FIG. 8A generates rising and falling edges in timing signal G7 (DQSP) that occur in the centers of the bit periods of signal RS (DQP), as shown in FIG. 8B, allowing flip-flop circuits 503 and 505 to capture accurate values of signal RS (DQP).

Figure 8C:
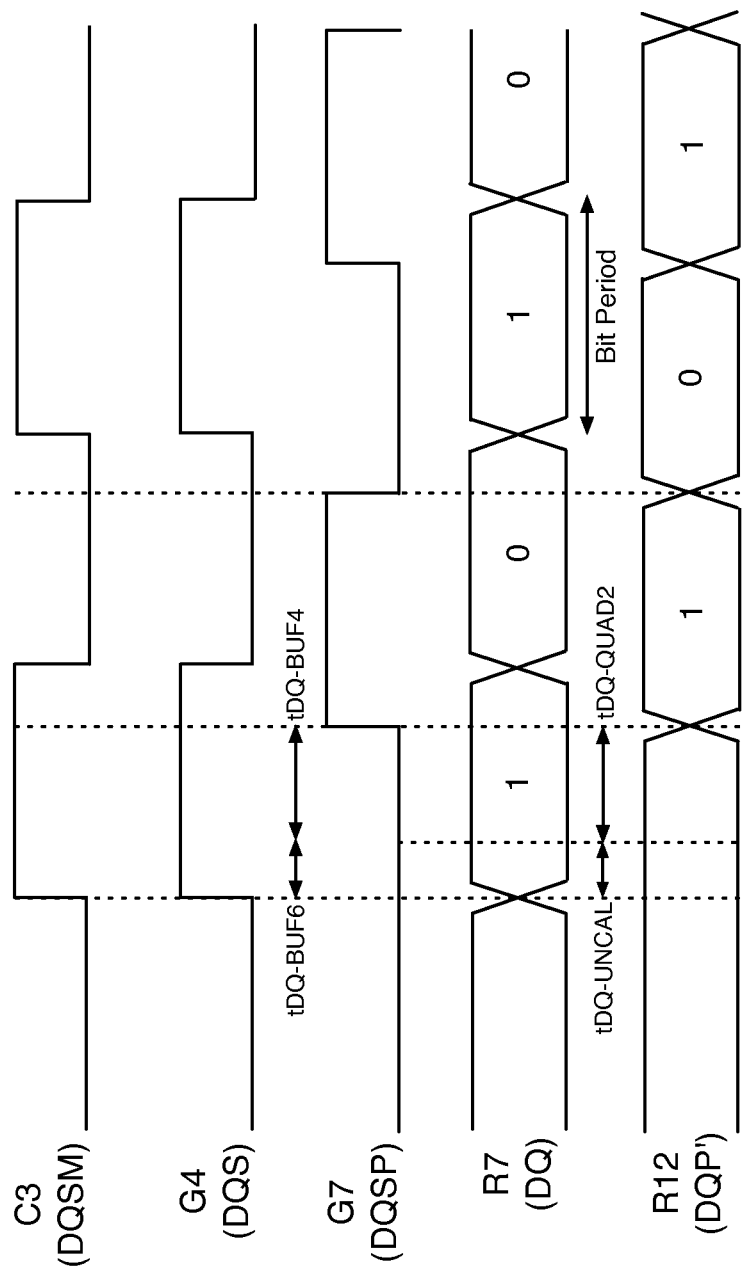
FIG. 8C is a timing diagram showing exemplary waveforms of a subset of the signals shown in FIG. 8A during calibration mode.

FIG. 8C is a timing diagram showing exemplary waveforms of a subset of the signals shown in FIG. 8A during calibration mode. The timing diagram of FIG. 8C illustrates exemplary waveforms for timing signal C3 (DQSM), timing signal G4 (DQS), timing signal G7 (DQSP), signal R7 (DQ), and signal R12 (DQP'). The exemplary waveforms of FIG. 8C are generated in a double data rate embodiment of FIG. 8A.

As shown in FIG. 8C, a repeating test pattern of 101010 . . . is generated in signal R7 (DQ) and in signal R12 (DQP') during calibration mode. Signal R12 (DQP') is delayed by tDQ-QUAD2+tDQ-UNCAL relative to signal R7 (DQ). During calibration mode, phase comparator circuit 602 and control circuit 603 align the rising and falling edges of timing signal G7 (DQSP) with corresponding transitions in signal R12 (DQP') by adjusting the delay tDQ-BUF6 of delay circuit 513, as described above with respect to FIGS. 6A-6B.

Figure 9A:
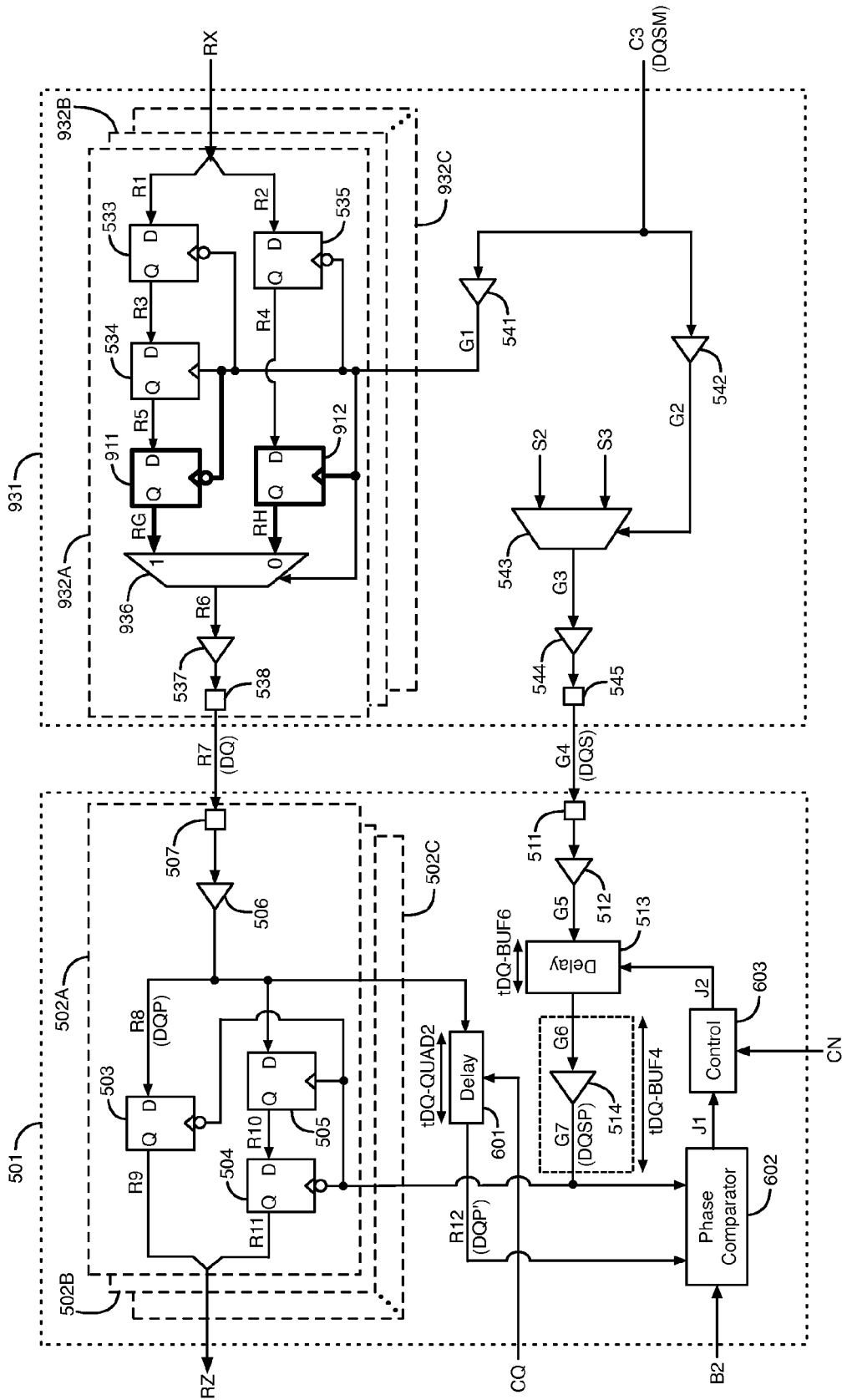
FIG. 9A illustrates an embodiment of the read data transmitter circuit of FIG. 1 providing read data that is delayed relative to the timing signal used to capture the read data to compensate for a delay added to the timing signal in the read data receiver circuit.

FIG. 9A illustrates an embodiment of the read data transmitter circuit of FIG. 1 providing read data that is delayed relative to the timing signal used to capture the read data. The delay in the read data compensates for a delay added to the timing signal in the read data receiver circuit. FIG. 9A illustrates a transmitter circuit 931 and receiver circuit 501. In an exemplary embodiment of FIG. 1, transmitter circuit 931 is an embodiment of read data transmitter circuit 122, and receiver circuit 501 is an embodiment of read data receiver circuit 112.

Transmitter circuit 931 includes transmitting circuits 932, buffer circuits 541-542, multiplexer circuit 543, buffer circuit 544, and pin 545. Transmitting circuits 932 include transmitting circuits 932A-932C. Transmitting circuit 932A includes D flip-flop circuits 533-535, D flip-flop circuits 911-912, multiplexer circuit 936, buffer circuit 537, and pin 538.

In the embodiment of FIG. 9A, transmitter circuit 931 may have any number of one or more transmitting circuits 932, such as transmitting circuits 932A-932C. Three transmitting circuits 932A-932C are shown in FIG. 9A as an example. Transmitting circuits 932B-932C and any other transmitting circuits 932 in transmitter circuit 931 have the same circuit structure as transmitting circuit 932A. Each of the transmitting circuits 932 in transmitter circuit 931 functions as described below with respect to transmitting circuit 932A.

In the embodiment of FIG. 9A, the minimum adjustable delay tDQ-BUF6(MIN) of delay circuit 513 plus the maximum non-adjustable delay tDQ-BUF4(MAX) of buffer circuit 514 is greater than tDQ-QUAD2, i.e., tDQ-BUF6(MIN)+tDQ-BUF4(MAX)>tDQ-QUAD2. Adjustments are made to the relative timing of signals R7 (DQ) and G4 (DQS) to allow receiving circuit 502A to capture the data in signal R7 (DQ). Data is provided in each signal R7 (DQ) one bit period after a rising edge in timing signal G4 (DQS). One bit period is the period of one data bit in each of signals RX. The delay of one bit period provided to the data in each signal R7 (DQ) compensates for the combined delay tDQ-BUF6+tDQ-BUF4 of delay circuit 513 and buffer circuit 514 to cause the edges of timing signal G7 (DQSP) to occur at or near the centers of the bit periods of signal R8 (DQP).

FIG. 9B is a timing diagram showing exemplary waveforms of a subset of the signals shown in FIG. 9A. The timing diagram of FIG. 9B illustrates exemplary waveforms for timing signal C3 (DQSM), timing signal G4 (DQS), timing signal G7 (DQSP), signal R7 (DQ), and signal R8 (DQP) during normal mode. The exemplary waveforms of FIG. 9B are generated in a double data rate embodiment of FIG. 9A.

In the example of FIG. 9B, the combined delay tDQ-BUF6+tDQ-BUF4 of delay circuit 513 and buffer circuit 514 equals one bit period of signal R7 (DQ) plus tDQ-QUAD2. As shown in FIG. 9B, the first data bit is provided in signal R7 (DQ) one bit period after a rising edge in timing signal G4 (DQS). The delay of one bit period is provided to signal R7 (DQ) to cause the rising and falling edges of timing signal G7 (DQSP) to occur at or near the centers of the bit periods of signal R8 (DQP), as shown in FIG. 9B, with tDQ-BUF4+tDQ-BUF6 greater than one-half the bit period of signal R8 (DQP).

In each of transmitting circuits 932, timing signal G1 is provided to a select input of multiplexer circuit 936, to the non-inverting clock inputs of flop-flop circuits 534 and 912, and to the inverting clock inputs of flip-flop circuits 533, 535, and 911. During each read operation, flip-flop circuits 533 and 535 store the values of signals R1 and R2 at their Q outputs in signals R3 and R4, respectively, in response to each falling edge in timing signal G1. Flip-flop circuits 534 and 912 store the values of signals R3 and R4 at their Q outputs in signals R5 and RH, respectively, in response to each rising edge in timing signal G1. Flip-flop circuit 911 stores the value of signal R5 at its Q output in signal RG in response to each falling edge in timing signal G1.

Each of the transmitting circuits 932 includes a multiplexer circuit 936 that has its 1 and 0 inputs reversed relative to multiplexer circuit 536. Signal RG generated by flip-flop circuit 911 is provided to the 1 multiplexing input of multiplexer circuit 936, and signal RH generated by flip-flop circuit 912 is provided to the 0 multiplexing input of multiplexer circuit 936. Timing signal G1 is provided to the select input of multiplexer circuit 936. Multiplexer circuit 936 provides the value of signal RG to its output in signal R6 during a logic high state in timing signal G1. Multiplexer circuit 936 provides the value of signal RH to its output in signal R6 during a logic low state in timing signal G1.

Buffer circuit 537 buffers signal R6 to generate buffered signal R7 (DQ) at pin 538. Flip-flop circuits 911-912 cause transmitting circuit 932A to delay the data bits in signal R7 (DQ) by one bit period of the data relative to a rising edge in timing signal G4 (DQS), as shown in FIG. 9B.

Transmitting circuit 932A provides the first, the third, the fifth, etc. data bits in signal R7 (DQ) in response to logic low states in signal C3 (DQSM). Transmitting circuit 932A provides the second, the fourth, the sixth, etc. data bits in signal R7 (DQ) in response to logic high states in signal C3 (DQSM).

FIG. 9C is a timing diagram showing exemplary waveforms of a subset of the signals shown in FIG. 9A. The timing diagram of FIG. 9C illustrates exemplary waveforms for timing signal C3 (DQSM), timing signal G4 (DQS), timing signal G7 (DQSP), signal R7 (DQ), and signal R12 (DQP') during calibration mode. The exemplary waveforms of FIG. 9C are generated in a double data rate embodiment of FIG. 9A.

As shown in FIG. 9C, a repeating test pattern of 101010 . . . is generated in signal R7 (DQ) and in signal R12 (DQP') during calibration mode, and signal R12 (DQP') is delayed by tDQ-QUAD2 relative to signal R7 (DQ). During calibration mode, phase comparator circuit 602 and control circuit 603 align the rising and falling edges of timing signal G7 (DQSP) with corresponding transitions in signal R12 (DQP') by adjusting the delay tDQ-BUF6 of delay circuit 513, as described above with respect to FIGS. 6A-6B.

According to a variation of FIG. 9A, flip-flop circuits 911-912 are removed from each of transmitter circuits 932, and signals R5 and R4 are provided to the 1 and 0 multiplexing inputs of multiplexer circuit 936, respectively. In this embodiment, timing signal G1 is provided to an inverting clock input of flip-flop circuit 534 and to non-inverting clock inputs of flip-flop circuits 533 and 535. In this embodiment, memory integrated circuit 130 delays the data in signals RX by one bit period after a rising edge in timing signal C3 (DQSM), or processor integrated circuit 101 causes a rising edge in timing signal C3 (DQSM) to occur one bit period earlier than the data in signals RX.

According to additional embodiments, data is provided to the read data transmitter circuit in signals RX two, three, four, or more bit periods of signals RX after a rising edge in timing signal C3 (DQSM). Read data transmitter circuit 531 as shown in FIG. 6A can be used to implement the embodiments in which the data in signals RX is delayed by an even number of bit periods after a rising edge in timing signal C3 (DQSM). Read data transmitter circuit 931 as shown in FIG. 9A can be used to implement the embodiments in which the data in signals RX is delayed by an odd number of bit periods after a rising edge in timing signal C3 (DQSM).

According to additional embodiments, a calibration is performed to provide data to the read data transmitter circuit a calibrated number of bit periods of signals RX after a rising edge in timing signal C3 (DQSM). As an example, initially signals RX are aligned with timing signal C3 (DQSM). If receiver circuit 501 determines that delay tDQ-BUF6 cannot be reduced enough to align signals R12 (DQP') and G7 (DQSP), then data signals RX are delayed by one or more bit periods relative to timing signal C3 (DQSM).

Figure 10A:
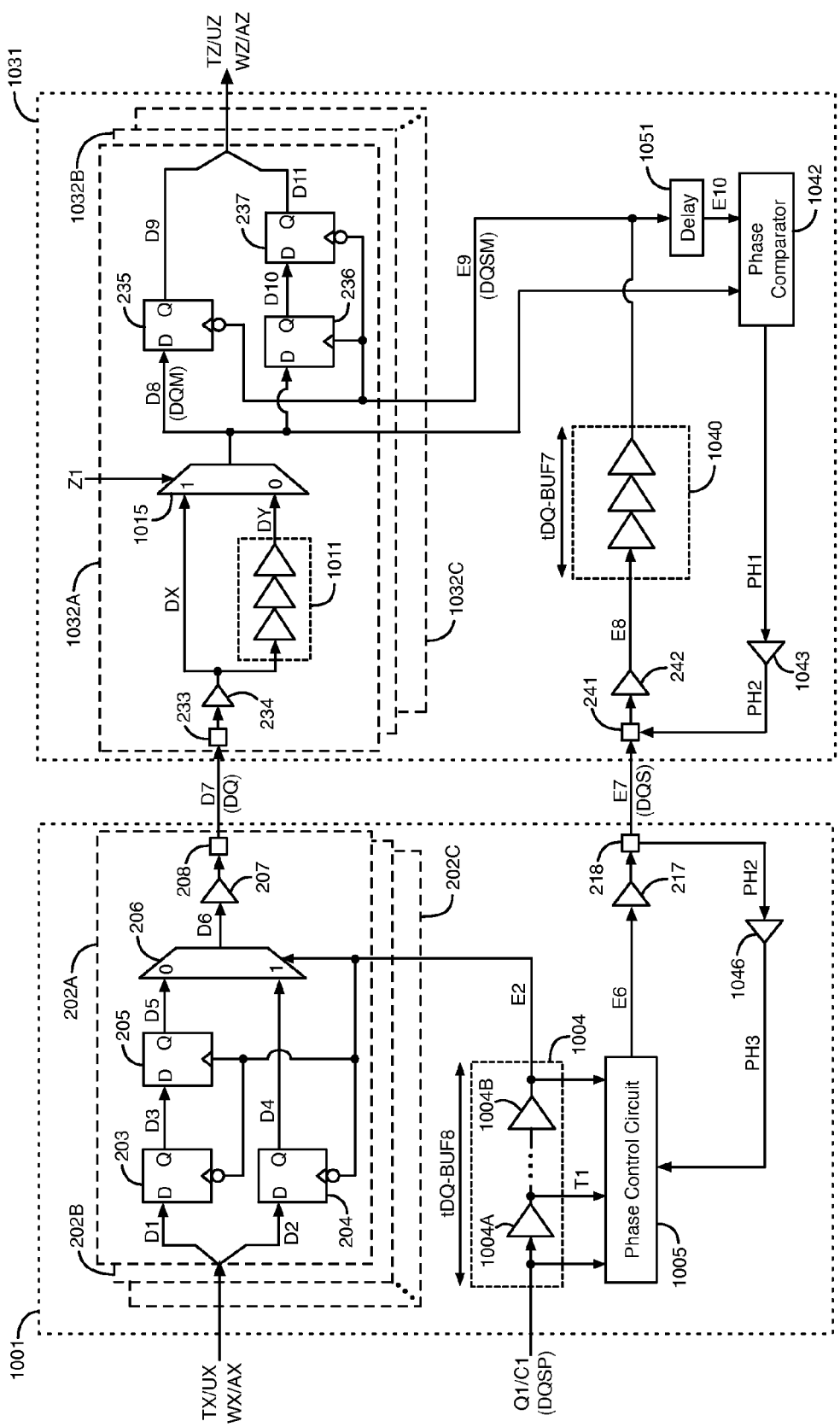
FIG. 10A illustrates an embodiment of the write data transmitter circuit and the command/address transmitter circuit of FIG. 1 that includes a phase control circuit, and another embodiment of the write data receiver circuit and the command/address receiver circuit of FIG. 1.

FIG. 10A illustrates an embodiment of a transmitter circuit 1001 and an embodiment of a receiver circuit 1031. In an exemplary embodiment of FIG. 1, write data transmitter circuit 111 is a first instance of transmitter circuit 1001, command/address transmitter circuit 113 is a second instance of transmitter circuit 1001, write data receiver circuit 121 is a first instance of receiver circuit 1031, and command/address receiver circuit 123 is a second instance of receiver circuit 1031.

Transmitter circuit 1001 includes transmitting circuits 202, phase control circuit 1005, pin 218, and buffer circuits 217, 1004, and 1046. Transmitting circuits 202 include transmitting circuits 202A-202C. Buffer circuit 1004 includes one, two, three, four, or more component buffers coupled together in series, in the example of FIG. 10A. Two component buffers 1004A-1004B of buffer circuit 1004 are shown as an example. Buffer circuit 1046 is an interface circuit that receives a signal from pin 218.

In the embodiment of FIG. 10A, transmitter circuit 1001 may have any number of one or more transmitting circuits 202, such as transmitting circuits 202A-202C. Three transmitting circuits 202A-202C are shown in FIG. 10A as an example. Transmitting circuits 202B-202C and the other transmitting circuits 202 in transmitter circuit 1001 have the same circuit structure as transmitting circuit 202A. Each of the transmitting circuits 202 in transmitter circuit 1001 functions as described herein with respect to transmitting circuit 202A.

Receiver circuit 1031 includes receiving circuits 1032, pin 241, buffer circuits 242, 1040, and 1043, phase comparator circuit 1042, and delay circuit 1051. Buffer circuit 1043 is an interface circuit that provides a signal to pin 241. Receiving circuits 1032 include receiving circuits 1032A-1032C. Receiving circuit 1032A includes pin 233, buffer circuit 234, buffer circuit 1011, multiplexer circuit 1015, and D flip-flop circuits 235-237. In some embodiments, D flip-flop circuits 235 and 236 are low-swing sampler circuits that are used to provide high-gain and narrow-aperture sampling of the incoming waveform in signal D8 (DQM). Each of buffer circuits 1011 and 1040 includes three component buffers coupled together in series, in the example of FIG. 10A. In other embodiments, buffer circuits 1011 and 1040 may have any number of component buffers.

In the embodiment of FIG. 10A, receiver circuit 1031 may have any number of one or more receiving circuits 1032, such as receiving circuits 1032A-1032C. Three receiving circuits 1032A-1032C are shown in FIG. 10A as an example. Receiving circuits 1032B-1032C and the other receiving circuits 1032 in receiver circuit 1031 have the same circuit structure as receiving circuit 1032A. Each of the receiving circuits 1032 in receiver circuit 1031 functions as described herein with respect to receiving circuit 1032A.

During calibration mode, control circuit 116 generates test signals TX and test signals UX, and processor circuit 115 generates timing signals Q1 and C1 (DQSP). Test signals TX and timing signal Q1 are provided to the first instance of transmitter circuit 1001 (i.e., an example of write data transmitter circuit 111), and test signals UX and timing signal C1 are provided to the second instance of transmitter circuit 1001 (i.e., an example of command/address transmitter circuit 113). Two of signals TX are provided to each of the transmitting circuits 202 in the first instance of transmitter circuit 1001. Two of signals UX are provided to each of the transmitting circuits 202 in the second instance of transmitter circuit 1001.

In the first instance of transmitter circuit 1001, signals D1 and D2 are a subset of signals TX during calibration mode.

In the second instance of transmitter circuit 1001, signals D1 and D2 are a subset of signals UX during calibration mode. Signals D1 and D2 are provided to the D inputs of flip-flop circuits 203 and 204, respectively.

Timing signals Q1 and C1 (DQSP) are provided to an input of buffer 1004A in the first and second instances, respectively, of transmitter circuit 1001. Buffer circuit 1004 buffers timing signal Q1/C1 to generate timing signal E2. Buffer circuit 1004 adds a delay tDQ-BUF8 to timing signal E2 relative to timing signal Q1/C1 (DQSP). Thus, buffer circuit 1004 functions as both a buffer and a delay circuit. Timing signal E2 is provided to an inverting clock input of each of flip-flop circuits 203-204, to a clock input of flip-flop circuit 205, and to a select input of multiplexer circuit 206 in each of transmitting circuits 202. Thus, transmitting circuits 202 form a double-data rate (DDR) transmitter. In other embodiments, the transmitting circuits may form a single data rate transmitter, a quad data rate transmitter, an octal data rate transmitter, or a transmitter based on another clocking mode.

Flip-flop circuit 203 stores the value of signal D1 at its Q output in signal D3 in response to each falling edge in timing signal E2. Flip-flop circuit 204 stores the value of signal D2 at its Q output in signal D4 in response to each falling edge in timing signal E2. Flip-flop circuit 205 stores the value of signal D3 at its Q output in signal D5 in response to each rising edge in timing signal E2. Signal D4 is provided to the 1 multiplexing input of multiplexer circuit 206, and signal D5 is provided to the 0 multiplexing input of multiplexer circuit 206.

Timing signal E2 is a periodic signal during calibration and normal modes. Multiplexer circuit 206 provides the value of signal D4 to its output in signal D6 when timing signal E2 is in a logic high state. Multiplexer circuit 206 provides the value of signal D5 to its output in signal D6 when timing signal E2 is in a logic low state. Signal D6 is provided to an input of buffer circuit 207. Buffer circuit 207 buffers signal D6 to generate signal D7 (DQ) at pin 208. Signal D7 (DQ) is transmitted to pin 233 at the input of buffer circuit 234 in receiver circuit 1032A.

Signal D7 (DQ) corresponds to one of signals TY and to one of signals UY in FIG. 1 in the respective first and second instances of transmitter circuit 1001 during calibration mode. Signal D7 (DQ) has a test pattern that may be, for example, a repeating pattern of logic high and low states (i.e., 1010 . . . ) in calibration mode.

Buffer circuit 234 buffers signal D7 (DQ) to generate buffered signal DX. Buffered signal DX is provided to the 1 multiplexing input of multiplexer circuit 1015 and to the input of buffer circuit 1011. Buffer circuit 1011 buffers signal DX to generate buffered signal DY. Buffered signal DY is provided to the 0 multiplexing input of multiplexer circuit 1015. Select signal Z1 is provided to the select input of multiplexer circuit 1015. During the normal and calibration modes of the system of FIG. 10A, select signal Z1 is in a logic high state, and multiplexer circuit 1015 provides the value of signal DX to its output in signal D8. Buffer circuit 1011 may be powered down when select signal Z1 is in a logic high state. Signal D8 is also referred to as signal DQM with respect to FIGS. 10A-10B. Signal D8 (DQM) is provided to the D inputs of flip-flop circuits 235-236.

In some embodiments, if the transitions in signal D7 (DQ) are aligned with the edges in timing signal E7 (DQS), for example during an operation compatible with a low-power double data rate mode such as LPDDR2 or LPDDR3, and the delay tDQ-BUF7 of buffer circuit 1040 is one-half a bit period longer than the delay of delay circuit 1011, then signal Z1 is set to a logic low state during normal mode. When signal Z1 is in a logic low state, multiplexer circuit 1015 provides the value of signal DY to its output in signal D8 (DQM).

Buffer 1004A buffers timing signal Q1/C1 to generate timing signal T1. Buffer 1004B buffers the second to last timing signal generated by buffer circuit 1004 (e.g., timing signal T1) to generate timing signal E2. Timing signals Q1/C1, T1, E2, and any other timing signals generated by buffer circuit 1004 are provided to inputs of phase control circuit 1005. In one embodiment, phase control circuit 1005 is a multiplexer circuit that selects timing signal Q1/C1, timing signal T1, timing signal E2, or another timing signal generated by buffer circuit 1004 as timing signal E6. In another embodiment, phase control circuit 1005 includes a phase blender, a phase mixer, or a phase interpolator that can generate a phase in timing signal E6 between the phases of two of its input timing signals Q1/C1, T1, E2, etc.

Timing signal E6 is provided to an input of buffer circuit 217. Buffer circuit 217 buffers timing signal E6 to generate timing signal E7 at pin 218. Timing signal E7 (DQS) corresponds to signals Q2 and C2 in FIG. 1 in the respective first and second instances of transmitter circuit 1001.

Timing signal E7 (DQS) is transmitted from pin 218 to pin 241 in receiver circuit 1031 at the input of buffer circuit 242. Buffer circuit 242 buffers timing signal E7 (DQS) to generate timing signal E8. Timing signal E8 is provided to the input of buffer circuit 1040. Buffer circuit 1040 buffers timing signal E8 to generate timing signal E9 (DQSM). Buffer circuit 1040 adds a delay tDQ-BUF7 to timing signal E9 (DQSM) relative to timing signal E8.

Timing signal E9 (DQSM) is provided to the inverting clock inputs of flip-flop circuits 235 and 237 and to the clock input of flip-flop circuit 236 in each of the receiving circuits 1032. Flip-flop circuit 235 stores the value of signal D8 (DQM) at its Q output in signal D9 in response to each falling edge in timing signal E9 (DQSM). Flip-flop circuit 236 stores the value of signal D8 (DQM) at its Q output in signal D10 in response to each rising edge in timing signal E9 (DQSM). Flip-flop circuit 237 stores the value of signal D10 at its Q output in signal D11 in response to each falling edge in timing signal E9 (DQSM).

Each of the receiving circuits 1032 generates a set of signals D9 and D11. The signals D9 and D11 generated by receiving circuits 1032 are collectively provided as signals TZ at outputs of the first instance of receiver circuit 1031 in calibration mode. The signals D9 and D11 generated by receiving circuits 1032 are collectively provided as signals UZ at outputs of the second instance of receiver circuit 1031 in calibration mode. The test patterns indicated by signals TZ and UZ are not stored in memory during calibration mode.

Timing signal E9 (DQSM) is provided to the input of delay circuit 1051. Delay circuit 1051 delays timing signal E9 (DQSM) by one-quarter of the period of timing signal E9 to generate delayed timing signal E10. Delayed timing signal E10 is provided to a first input of phase comparator circuit 1042. Signal D8 (DQM) is provided to a second input of phase comparator circuit 1042. Phase comparator circuit 1042 compares delayed timing signal E10 to signal D8 (DQM) to generate digital phase comparison signal PH1 during calibration mode.

In an embodiment in which signal D8 (DQM) has a repeating test pattern of 10101010 . . . during calibration mode, phase comparator circuit 1042 generates a first value in phase comparison signal PH1 in response to the transitions in signal D8 (DQM) being ahead of the rising and falling edges of timing signal E10 and a second value in phase comparison signal PH1 in response to the transitions in signal D8 (DQM) being behind the rising and falling edges of timing signal E10.

Phase comparison signal PH1 is provided to the input of buffer circuit 1043. Buffer circuit 1043 buffers phase comparison signal PH1 to generate phase comparison signal PH2. During calibration mode, phase comparison signal PH2 is transmitted to the input of buffer circuit 1046 in transmitter circuit 1001 through pin 241 and pin 218. In an alternative embodiment, phase comparison signal PH2 is transmitted through a dedicated conductor and dedicated pins in each integrated circuit or by another means from receiver circuit 1031 to transmitter circuit 1001. Buffer circuit 1046 buffers phase comparison signal PH2 to generate phase comparison signal PH3. Phase comparison signal PH3 is provided to a control input of phase control circuit 1005. The value of phase comparison signal PH3 is equal to the corresponding value of phase comparison signal PH1.

During the calibration mode, phase control circuit 1005 adjusts the phase of timing signal E6 based on phase comparison signal PH3. Phase control circuit 1005 adjusts the phase of timing signal E6 during calibration mode until the phase comparison signal PH3 indicates that the rising and falling edges of delayed timing signal E10 are aligned with the transitions in signal D8 (DQM). After the phase comparison signal PH3 indicates that the rising and falling edges of delayed timing signal E10 are aligned with the transitions in signal D8 (DQM), phase control circuit 1005 maintains the phase offset between timing signal E6 and timing signal Q1/C1 constant during normal mode.

During each write operation, write data is provided to the first instance of transmitter circuit 1001 (i.e., an example of write data transmitter circuit 111) in signals WX. During each read or write operation, a read or write command and an address are provided to the second instance of transmitter circuit 1001 (i.e., an example of command/address transmitter circuit 113) in signals AX. Two of signals WX are provided to each of the transmitting circuits 202 in the first instance of transmitter circuit 1001. Two of signals AX are provided to each of the transmitting circuits 202 in the second instance of transmitter circuit 1001.

In the first instance of transmitter circuit 1001, signals D1 and D2 are a subset of signals WX during write operations in normal mode. In the second instance of transmitter circuit 1001, signals D1 and D2 are a subset of signals AX during read and write operations in normal mode. Signals D1 and D2 are provided to the D inputs of flip-flop circuits 203 and 204, respectively, in transmitting circuit 202A.

In the first instance of transmitter circuit 1001, timing signal Q1 (DQSP) is provided to the input of buffer 1004A during write operations in normal mode. In the second instance of transmitter circuit 1001, timing signal C1 (DQSP) is provided to the input of buffer 1004A during read and write operations in normal mode. Processor circuit 115 causes timing signals Q1 and C1 (DQSP) to be digital periodic signals during write and read operations in normal mode.

During normal mode, each of the transmitting circuits 202 generates a signal D7 (DQ) in response to timing signal E2, and transmitter circuit 1001 generates timing signal E7 (DQS) in response to timing signal Q1 or C1, as described above with respect to the calibration mode. In the first instance of transmitter circuit 1001, signals D7 (DQ) indicate the write data as indicated by signals WX. In the second instance of transmitter circuit 1001, signals D7 (DQ) indicate the read or write command and the address as indicated by signals AX.

Phase offset tDQPH refers to the phase offset that phase control circuit 1005 generates in timing signal E6 relative to timing signal Q1/C1 (DQSP). In normal mode, phase control circuit 1005 causes timing signal E6 to have the phase offset tDQPH relative to timing signal Q1/C1 (DQSP) that was generated during the previous calibration mode in response to phase comparison signal PH3. Buffer circuit 217 buffers timing signal E6 to generate timing signal E7 (DQS) during normal mode at pin 218. Timing signal E7 (DQS) is transmitted to the input of buffer circuit 242 at pin 241 during normal mode. Buffer circuits 242 and 1040 buffer timing signal E7 (DQS) to generate timing signal E9 (DQSM) during normal mode.

Signal D7 (DQ) generated by transmitting circuit 202A is transmitted to pin 233 at the input of buffer circuit 234 in receiver circuit 1032A in normal mode. Signal D7 (DQ) corresponds to one of signals WY and to one of signals AY in FIG. 1 in respective first and second instances of transmitter circuit 1001 during normal mode. Buffer circuit 234 buffers signal D7 (DQ) to generate signal DX. Multiplexer circuit 1015 provides the value of signal DX to its output in signal D8 (DQM) when select signal Z1 is in a logic high state.

In normal mode, flip-flop circuits 235-237 store the values of signal D8 (DQM) in signals D9 and D11 in response to timing signal E9 (DQSM), as described above. Each of receiving circuits 1032 generates a set of signals D9 and D11. The signals D9 and D11 generated by receiving circuits 1032 are collectively provided as signals WZ at outputs of the first instance of receiver circuit 1031 in normal mode. The signals D9 and D11 generated by receiving circuits 1032 are collectively provided as signals AZ at outputs of the second instance of receiver circuit 1031 in normal mode.

Figure 10B:
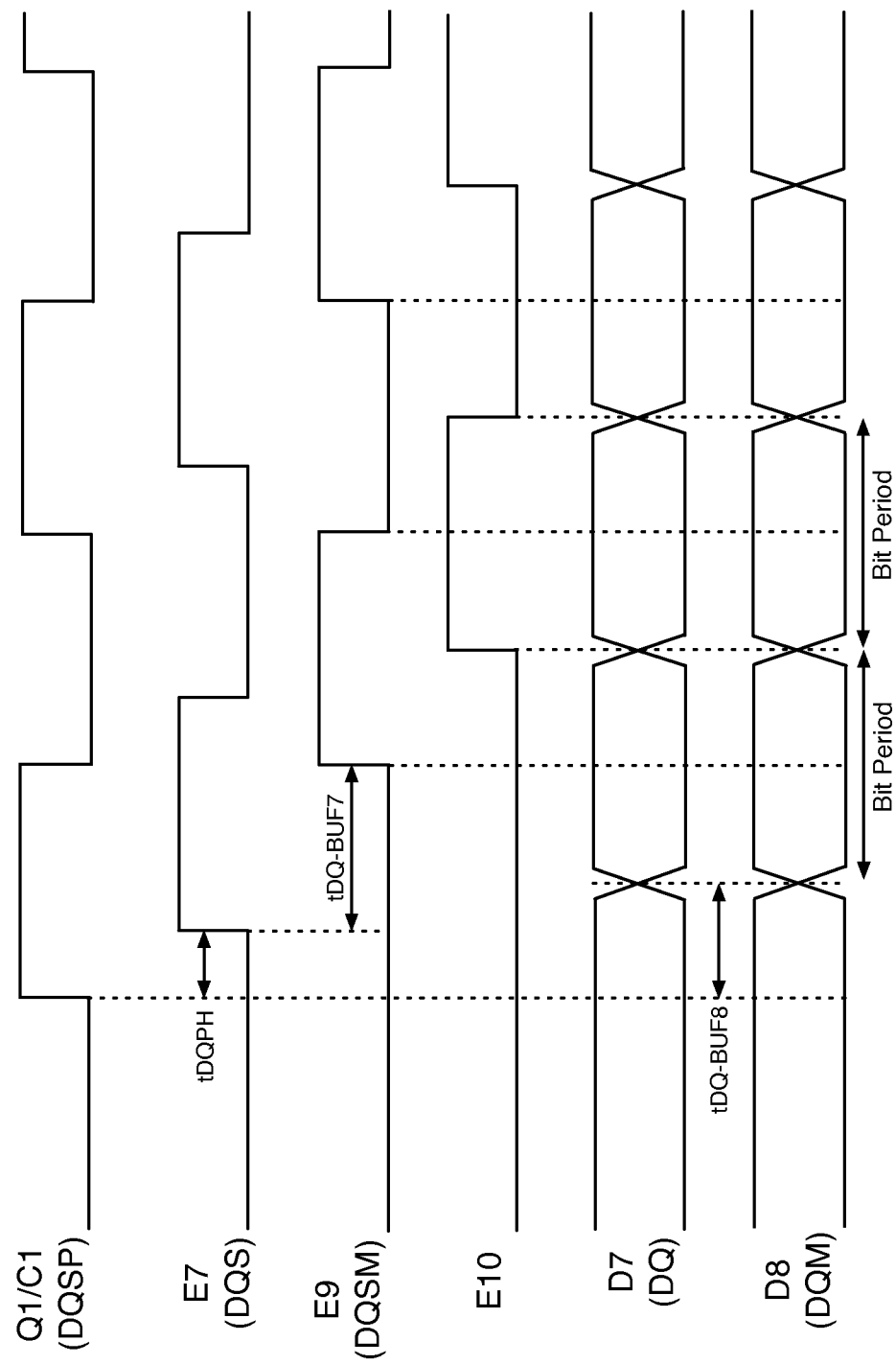
FIG. 10B is a timing diagram showing exemplary waveforms of a subset of the signals shown in FIG. 10A.

FIG. 10B is a timing diagram showing exemplary waveforms of a subset of the signals shown in FIG. 10A. The timing diagram of FIG. 10B illustrates exemplary waveforms for timing signal Q1/C1 (DQSP), timing signal E7 (DQS), timing signal E9 (DQSM), timing signal E10, signal D7 (DQ), and signal D8 (DQM). The exemplary waveforms of FIG. 10B are generated in a double data rate embodiment of FIG. 10A. While a double data rate embodiment is shown, data transmission systems having any of the techniques described herein can include a single data rate system, a quad data rate system, an octal data rate system, or systems based on other types of clocking modes.

When the rising and falling edges of delayed timing signal E10 are aligned with the transitions in signal D8 (DQM), the rising and falling edges of timing signal E9 (DQSM) occur at or near the centers of corresponding bit periods in signal D8 (DQM), as shown in FIG. 10B, because the delay of delay circuit 1051 equals one-half the bit period of signal D8 (DQM). Receiving circuits 1032 are able to capture the values of signal D8 (DQM) during normal mode, because the rising and falling edges of timing signal E9 (DQSM) occur at or near the centers of corresponding bit periods in signal D8 (DQM).

Figure 11A:
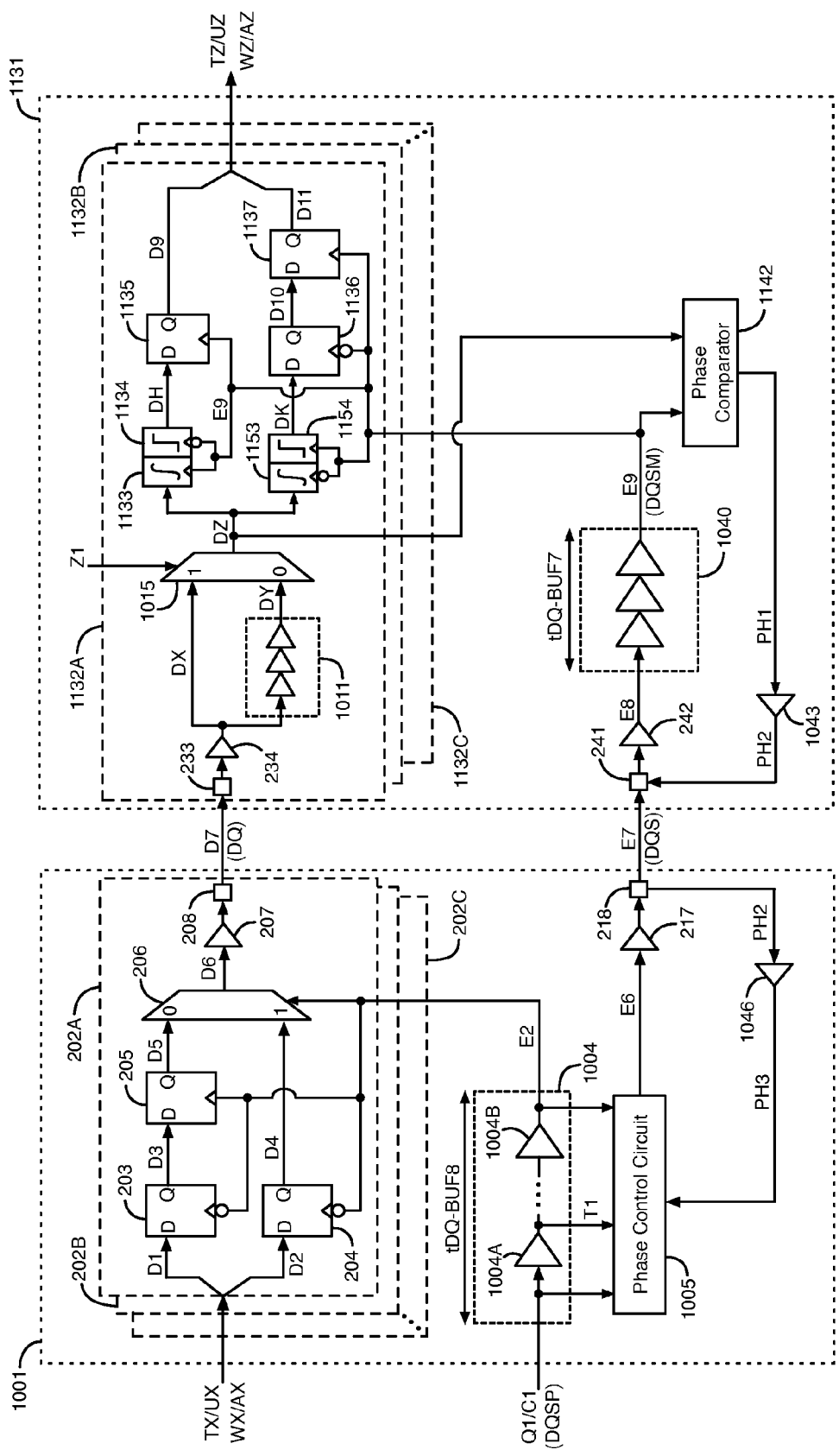
FIG. 11A illustrates an embodiment of the write data receiver circuit and the command/address receiver circuit of FIG. 1 that includes integrator circuits.

FIG. 11A illustrates an embodiment of a receiver circuit 1131 that includes integrator circuits. FIG. 11A also illustrates transmitter circuit 1001. In an exemplary embodiment of FIG. 1, write data transmitter circuit 111 is a first instance of transmitter circuit 1001, command/address transmitter circuit 113 is a second instance of transmitter circuit 1001, write data receiver circuit 121 is a first instance of receiver circuit 1131, and command/address receiver circuit 123 is a second instance of receiver circuit 1131.

The structure and operation of transmitter circuit 1001 is shown in and described above with respect to FIGS. 10A-10B. Receiver circuit 1131 includes receiving circuits 1132, pin 241, buffer circuits 242, 1040, and 1043, and phase comparator circuit 1142. Receiving circuits 1132 include receiving circuits 1132A-1132C. Receiving circuit 1132A includes pin 233, buffer circuit 234, buffer circuit 1011, multiplexer circuit 1015, integrator circuits 1133 and 1153, edge-triggered comparator circuits 1134 and 1154, and D flip-flop circuits 1135-1137.

In the embodiment of FIG. 11A, receiver circuit 1131 may have any number of one or more receiving circuits 1132, such as receiving circuits 1132A-1132C. Three receiving circuits 1132A-1132C are shown in FIG. 11A as an example. Receiving circuits 1132B-1132C and the other receiving circuits 1132 in receiver circuit 1131 have the same circuit structure as receiving circuit 1132A. Each of the receiving circuits 1132 in receiver circuit 1131 functions as described below with respect to receiving circuit 1132A.

During calibration and normal modes, multiplexer circuit 1015 provides the value of signal DX to its output in signal DZ when signal Z1 is in a logic high state. In some embodiments, multiplexer circuit 1015 provides the value of signal DY to its output in signal DZ when signal Z1 is in a logic low state in normal mode, as described above with respect to FIG. 10A. Signal DZ is provided to a first input of phase comparator circuit 1142. Timing signal E9 (DQSM) is provided to a second input of phase comparator circuit 1142.

During calibration mode, phase comparator circuit 1142 compares timing signal E9 (DQSM) to signal DZ to generate phase comparison signal PH1. The value of phase comparison signal PH1 is provided to phase control circuit 1005 in phase comparison signal PH3 using buffer circuits 1043 and 1046, as described above with respect to FIG. 10A. Phase control circuit 1005 adjusts the phase of timing signal E6 during calibration mode until the phase comparison signal PH3 indicates that the rising and falling edges of timing signal E9 (DQSM) are aligned with the transitions in signal DZ. After the phase comparison signal PH3 indicates that the rising and falling edges of timing signal E9 (DQSM) are aligned with the transitions in signal DZ, phase control circuit 1005 maintains the phase offset tDQPH between timing signal E6 and timing signal Q1/C1 constant, until a subsequent calibration mode.

Signal DZ is also provided to inputs of integrator circuits 1133 and 1153. Timing signal E9 (DQSM) is provided to the inverting clock inputs of integrator circuit 1153 and edge-triggered comparator circuit 1134 and to the clock inputs of integrator circuit 1133 and edge-triggered comparator circuit 1154. Integrator circuit 1133 performs an integration operation on signal DZ in response to each of the rising edges of timing signal E9 (DQSM) to generate an output signal. Edge-triggered comparator circuit 1134 compares the output signal of integrator circuit 1133 to a reference in response to each falling edge of timing signal E9 (DQSM) to generate signal DH. Because comparator circuit 1134 is edge-triggered, signal DH indicates the previous bit, until the next falling edge of timing signal E9 (DQSM).

Integrator circuit 1153 performs an integration operation on signal DZ in response to each of the falling edges of timing signal E9 (DQSM) to generate an output signal. Edge-triggered comparator circuit 1154 compares the output signal of integrator circuit 1153 to a reference in response to each rising edge of timing signal E9 (DQSM) to generate signal DK. Because comparator circuit 1154 is edge-triggered, signal DK indicates the previous bit, until the next rising edge of timing signal E9 (DQSM). Each of edge-triggered comparator circuits 1134 and 1154 may, for example, include a comparator followed by an edge-triggered flip-flop. Further details of a receiving circuit that uses an integrator circuit is described in U.S. patent application publication number 20100315142, published Dec. 16, 2010, which is incorporated by reference herein in its entirety.

Signal DH is provided to the D input of flip-flop circuit 1135. Signal DK is provided to the D input of flip-flop circuit 1136. Timing signal E9 (DQSM) is provided to the clock inputs of flip-flop circuits 1135 and 1137 and to the inverting clock input of flip-flop circuit 1136. Flip-flop circuit 1135 stores the value of signal DH at its Q output in signal D9 in response to each rising edge in timing signal E9 (DQSM). Flip-flop circuit 1136 stores the value of signal DK at its Q output in signal D10 in response to each falling edge in timing signal E9 (DQSM). Flip-flop circuit 1137 stores the value of signal D10 at its Q output in signal D11 in response to each rising edge in timing signal E9 (DQSM). Each of receiving circuits 1132 generates a set of signals D9 and D11.

During calibration mode, the signals D9 and D11 generated by receiving circuits 1132 are collectively provided as signals TZ at outputs of the first instance of receiver circuit 1131 and as signals UZ at outputs of the second instance of receiver circuit 1131. During normal mode, the signals D9 and D11 generated by receiving circuits 1132 are collectively provided as signals WZ at outputs of the first instance of receiver circuit 1131 and as signals AZ at outputs of the second instance of receiver circuit 1131.

Figure 11B:
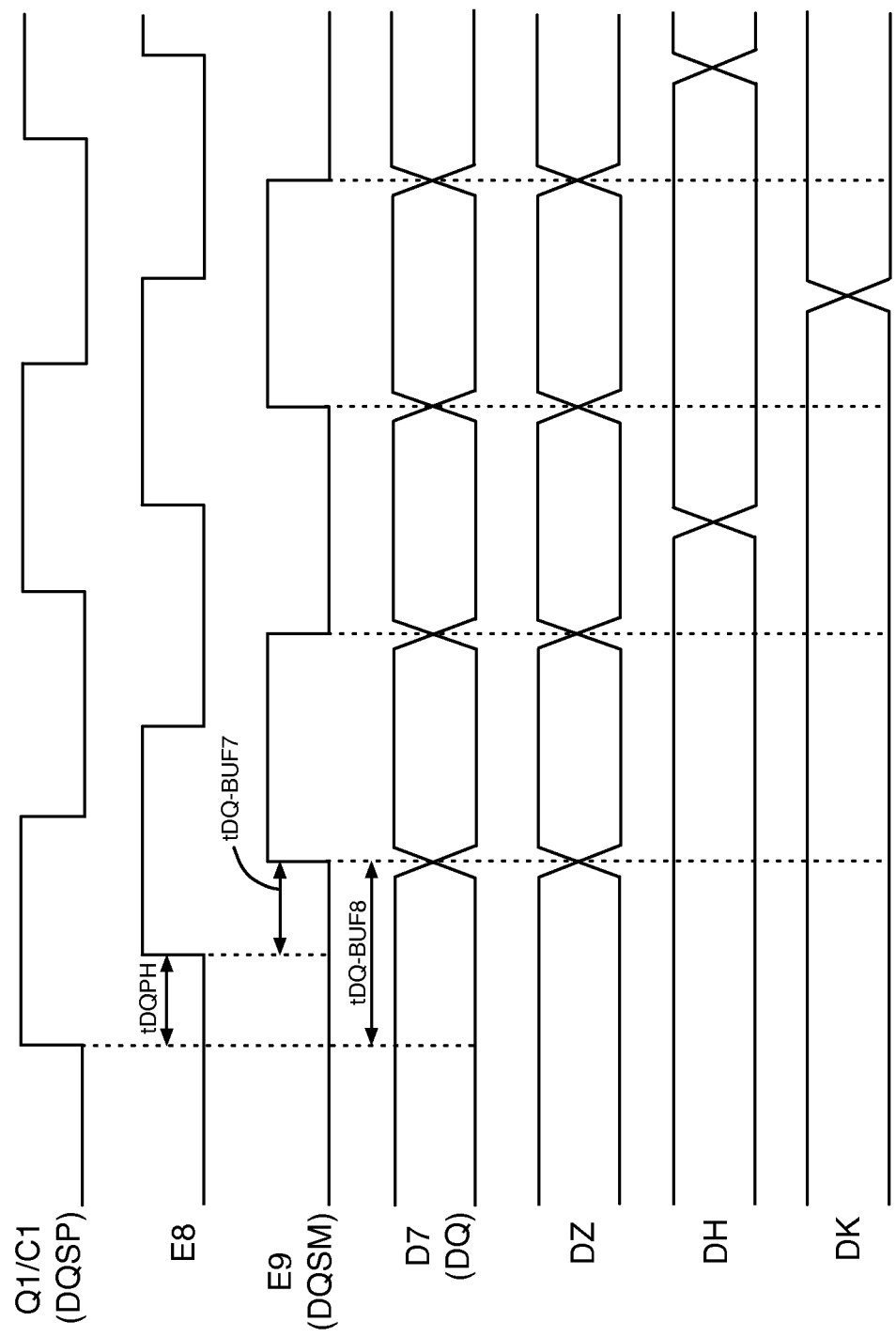
FIG. 11B is a timing diagram showing exemplary waveforms of a subset of the signals shown in FIG. 11A.

FIG. 11B is a timing diagram showing exemplary waveforms of a subset of the signals shown in FIG. 11A. The timing diagram of FIG. 11B illustrates exemplary waveforms for timing signal Q1/C1 (DQSP), timing signal E8, timing signal E9 (DQSM), signal D7 (DQ), signal DZ, signal DH, and signal DK. The exemplary waveforms of FIG. 11B are generated using double data rate timing.

As shown in FIG. 11B, timing signal E8 is delayed by tDQPH relative to timing signal Q1/C1 (DQSP), timing signal E9 (DQSM) is delayed by tDQ-BUF7 relative to timing signal E8, and signal D7 (DQ) is delayed by tDQ-BUF8 relative to timing signal Q1/C1 (DQSP). After calibration mode, the rising and falling edges of timing signal E9 (DQSM) are aligned with corresponding transitions in signal DZ, as shown in FIG. 11B. The delays of buffer circuit 234 and multiplexer circuit 1015 are small relative to the periods of these signals. Circuits 1133-1134 and 1153-1154 delay signals DH and DK, respectively, as shown in FIG. 11B, allowing receiving circuits 1132 to capture the values of signals DH and DK during normal mode.

Figure 12A:
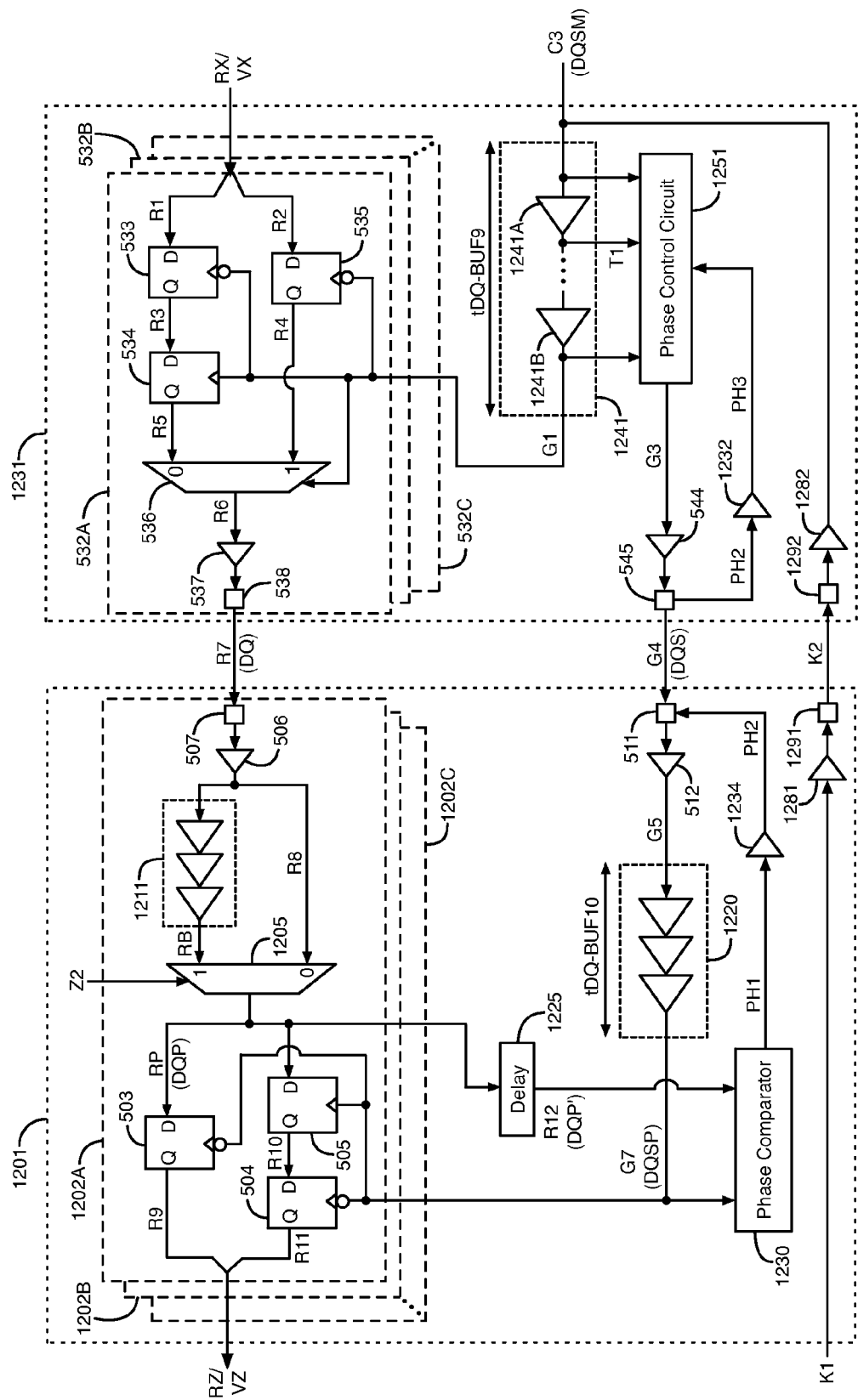
FIG. 12A illustrates another embodiment of the write data transmitter circuit and the command/address transmitter circuit of FIG. 1, and an embodiment of the write data receiver circuit and the command/address receiver circuit of FIG. 1 that includes a phase control circuit.

FIG. 12A illustrates an embodiment of a transmitter circuit 1231 and an embodiment of a receiver circuit 1201. In an exemplary embodiment of FIG. 1, transmitter circuit 1231 is an embodiment of read data transmitter circuit 122, and receiver circuit 1201 is an embodiment of read data receiver circuit 112.

Transmitter circuit 1231 includes transmitting circuits 532, pins 545 and 1292, phase control circuit 1251, and buffer circuits 544, 1232, 1241, and 1282. Buffer circuit 1241 includes one, two, three, four, or more component buffers coupled together in series, in the example of FIG. 12A. Two component buffers 1241A-1241B of buffer circuit 1241 are shown as an example. Buffer circuits 1232 and 1282 are interface circuits. Transmitting circuits 532 include transmitting circuits 532A-532C. The circuit structure and operation of transmitting circuits 532 are described above with respect to FIGS. 5A-6B.

Receiver circuit 1201 includes receiving circuits 1202, pins 511 and 1291, buffer circuits 512, 1234, 1220, and 1281, delay circuit 1225, and phase comparator circuit 1230. Receiving circuits 1202 include receiving circuits 1202A-1202C. Receiving circuit 1202A includes D flip-flop circuits 503-505, buffer circuit 506, pin 507, multiplexer circuit 1205, and buffer circuit 1211. Each of the buffer circuits 1211 and 1220 includes three component buffers coupled together in series, in the example of FIG. 12A. In other embodiments, buffer circuits 1211 and 1220 may have any number of component buffers. Buffer circuits 1234 and 1281 are interface circuits.

Receiver circuit 1201 may have any number of one or more receiving circuits 1202, such as receiving circuits 1202A-1202C. Three receiving circuits 1202A-1202C are shown in FIG. 12A as an example. Receiving circuits 1202B-1202C and the other receiving circuits 1202 in receiver circuit 1201 have the same circuit structure as receiving circuit 1202A. Each of the receiving circuits 1202 in receiver circuit 1201 functions as described below with respect to receiving circuit 1202A.

Test signals VX and timing signal C3 (DQSM) are provided to transmitter circuit 1231 during calibration mode. Two of signals VX are provided to each of the transmitting circuits 532 in transmitter circuit 1231. Signals R1 and R2 are a subset of signals VX during calibration mode. Signals R1 and R2 are provided to the D inputs of flip-flop circuits 533 and 535, respectively, as described above. Transmitting circuits 532 function as described above with respect to FIG. 5A. Signal R7 (DQ) generated by transmitting circuit 532A corresponds to one of signals VY in FIG. 1 during calibration mode. Signal R7 (DQ) has a test pattern that may be, for example, a repeating pattern of logic high and low states (i.e., 1010 . . . ) in calibration mode.

Signal R7 (DQ) is provided to the input of buffer circuit 506 through pin 507. Buffer circuit 506 buffers signal R7 (DQ) to generate a buffered signal R8. Buffered signal R8 is provided to the input of buffer circuit 1211 and to the 0 multiplexing input of multiplexer circuit 1205. Buffer circuit 1211 buffers signal R8 to generate a buffered signal RB at the 1 multiplexing input of multiplexer circuit 1205 when buffer circuit 1211 is powered on. A select signal Z2 is provided to the select input of multiplexer circuit 1205. During the normal and calibration modes of the system of FIG. 12A, buffer circuit 1211 may be powered down, select signal Z2 is in a logic low state, and multiplexer circuit 1205 provides the value of signal R8 to its output in signal RP (DQP). Signal RP (DQP) is provided to the D inputs of flip-flop circuits 503 and 505 and to the input of delay circuit 1225.

In some embodiments, if the transitions in signal R7 (DQ) are aligned with the edges in signal G4 (DQS), for example during an operation compatible with a low-power double data rate mode such as LPDDR2 or LPDDR3, and the delay tDQ-BUF10 of buffer circuit 1220 is one-half a bit period longer than the delay of delay circuit 1211, then signal Z2 is set to a logic high state during normal mode. When signal Z2 is in a logic high state, multiplexer circuit 1205 provides the value of signal RB to its output in signal RP (DQP).

In some embodiments, timing signal C3 (DQSM) is generated by command/address receiver circuit 123, as described above with respect to FIG. 1. In other embodiments, another periodic timing signal K1 is generated in processor integrated circuit 101. Buffer circuit 1281 buffers timing signal K1 to generate timing signal K2. Timing signal K2 is transmitted to the input of buffer circuit 1282 through pins 1291-1292. Buffer circuit 1282 buffers timing signal K2 to generate timing signal C3 (DQSM).

Timing signal C3 (DQSM) is provided to an input of buffer circuit 1241. Buffer circuit 1241 buffers timing signal C3 (DQSM) to generate a buffered timing signal G1. Buffer circuit 1241 adds a delay tDQ-BUF9 to timing signal G1 relative to timing signal C3 (DQSM). Thus, buffer circuit 1241 functions as a buffer and a delay circuit. Timing signal G1 is provided to a select input of multiplexer circuit 536, to the clock input of flop-flop circuit 534, and to the inverting clock inputs of flip-flop circuits 533 and 535 in each of transmitting circuits 532.

Buffer 1241A buffers timing signal C3 (DQSM) to generate timing signal T1. Buffer 1241B buffers the second-to-last timing signal generated by buffer circuit 1241 (e.g., timing signal T1) to generate timing signal G1. Timing signals C3 (DQSM), T1, G1, and any other timing signals generated by buffer circuit 1241 are provided to inputs of phase control circuit 1251. In one embodiment, phase control circuit 1251 is a multiplexer circuit that selects timing signal C3 (DQSM), timing signal T1, timing signal G1, or another timing signal generated by buffer circuit 1241 as timing signal G3. In another embodiment, phase control circuit 1251 includes a phase blender, a phase mixer, or a phase interpolator that can generate a phase in timing signal G3 between the phases of two of its input timing signals C3 (DQSM), T1, G1, etc.

Timing signal G3 is provided to the input of buffer circuit 544. Buffer circuit 544 buffers timing signal G3 to generate a timing signal G4 (DQS) at pin 545. Timing signal G4 (DQS) is transmitted to pin 511 at the input of buffer circuit 512 in receiver circuit 1201. Buffer circuit 512 buffers timing signal G4 (DQS) to generate timing signal G5. Timing signal G5 is provided to the input of buffer circuit 1220. Buffer circuit 1220 buffers timing signal G5 to generate buffered timing signal G7 (DQSP). Buffer circuit 1220 adds a delay tDQ-BUF10 to timing signal G7 (DQSP) relative to timing signal G5. Timing signal G7 (DQSP) is provided to the clock input of flip-flop circuit 505 and to the inverting clock inputs of flip-flop circuits 503-504.

Timing signal G7 (DQSP) is also provided to a first input of phase comparator circuit 1230. Delay circuit 1225 delays signal RP (DQP) by a delay tDQ-QUAD2 that equals one-quarter of the period of timing signal G7 (DQSP) to generate delayed signal R12 (DQP'). Delayed signal R12 (DQP') is provided to a second input of phase comparator circuit 1230. During calibration mode, phase comparator circuit 1230 compares timing signal G7 (DQSP) to delayed signal R12 (DQP') to generate phase comparison signal PH1.

In an embodiment in which signal RP (DQP) has a repeating test pattern of 10101010 . . . during calibration mode, phase comparator circuit 1230 generates a first value in phase comparison signal PH1 in response to the transitions in signal R12 (DQP') being ahead of the rising and falling edges of timing signal G7 (DQSP) and a second value in phase comparison signal PH1 in response to the transitions in signal R12 (DQP') being behind the rising and falling edges of timing signal G7 (DQSP).

Phase comparison signal PH1 is provided to an input of buffer circuit 1234. Buffer circuit 1234 buffers phase comparison signal PH1 to generate a buffered phase comparison signal PH2. Phase comparison signal PH2 is transmitted to an input of buffer circuit 1232 in transmitter circuit 1231 through pins 511 and 545 during calibration mode. In an alternative embodiment, phase comparison signal PH2 is transmitted through a dedicated conductor and dedicated pins in each integrated circuit. Buffer circuit 1232 buffers phase comparison signal PH2 to generate a buffered phase comparison signal PH3. Phase comparison signal PH3 is provided to a control input of phase control circuit 1251. Phase comparison signal PH3 indicates the same digital value as phase comparison signal PH1.

Phase control circuit 1251 adjusts the phase of timing signal G3 during calibration mode until the phase comparison signal PH3 indicates that the rising and falling edges of timing signal G7 (DQSP) are aligned with the transitions in signal R12 (DQP'). After the phase comparison signal PH3 indicates that the rising and falling edges of timing signal G7 (DQSP) are aligned with the transitions in signal R12 (DQP'), phase control circuit 1251 maintains the phase offset tDQPH between timing signal G3 and timing signal C3 (DQSM) constant during normal mode, until the next calibration mode.

During read operations in normal mode, two of the signals RX that indicate the read data are provided to each of the transmitting circuits 532 in transmitter circuit 1231. Signals R1 and R2 are provided to transmitting circuit 532A. Signals R1 and R2 are a subset of signals RX during read operations in normal mode. Signals R1 and R2 are provided to the D inputs of flip-flop circuits 533 and 535, respectively, in transmitting circuit 532A. Signal R7 (DQ) generated by transmitting circuit 532A corresponds to one of signals RY in FIG. 1 during normal mode. Also, during read operations in normal mode, timing signal C3 (DQSM) is provided to transmitter circuit 1231, and timing signal G7 (DQSP) is generated in receiver circuit 1201 based on timing signal C3 (DQSM), as described above.

Buffer circuit 506 buffers signal R7 (DQ) to generate signal R8, and multiplexer circuit 1205 provides the value of signal R8 to its output in signal RP (DQP) in normal mode. Flip-flop circuit 503 stores the value of signal RP (DQP) at its Q output in signal R9 in response to each falling edge in timing signal G7 (DQSP). Flip-flop circuit 505 stores the value of signal RP (DQP) at its Q output in signal R10 in response to each rising edge in timing signal G7 (DQSP). Flip-flop circuit 504 stores the value of signal R10 at its Q output in signal R11 in response to each falling edge in timing signal G7 (DQSP). Each of receiving circuits 1202 generates a set of signals R9 and R11. The signals R9 and R11 generated by receiving circuits 1202 are collectively provided as signals RZ at outputs of receiver circuit 1201. Signals RZ indicate the read data for a read operation.

Figure 12B:
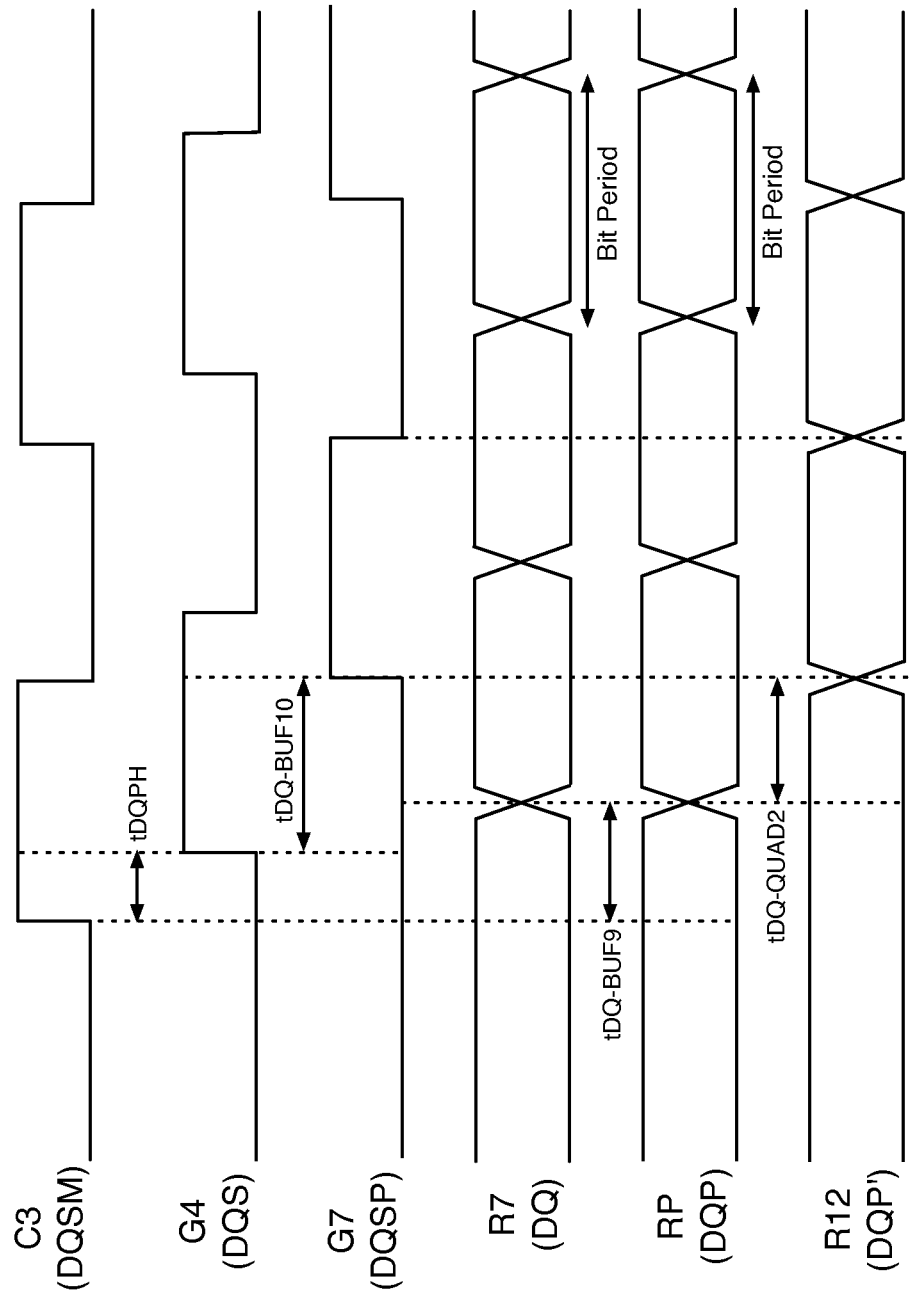
FIG. 12B is a timing diagram showing exemplary waveforms of a subset of the signals shown in FIG. 12A.

FIG. 12B is a timing diagram showing exemplary waveforms of a subset of the signals shown in FIG. 12A. The timing diagram of FIG. 12B illustrates exemplary waveforms for timing signal C3 (DQSM), timing signal G4 (DQS), timing signal G7 (DQSP), signal R7 (DQ), signal RP (DQP), and signal R12 (DQP'). The exemplary waveforms of FIG. 12B are generated in a double data rate embodiment of FIG. 12A.

When the rising and falling edges of timing signal G7 (DQSP) are aligned with the transitions in signal R12 (DQP') after calibration mode, the rising and falling edges of timing signal G7 (DQSP) occur at or near the centers of corresponding bit periods of signal RP (DQP), as shown in FIG. 12B, because the delay tDQ-QUAD2 of delay circuit 1225 equals one-half the bit period of signal RP (DQP). Receiving circuits 1202 are able to capture accurate values of signal RP (DQP) during normal mode, because the rising and falling edges of timing signal G7 (DQSP) occur at or near the centers of corresponding bit periods of signal RP (DQP).

The foregoing description of the exemplary embodiments has been presented for the purposes of illustration and description. The foregoing description is not intended to be exhaustive or limiting to the examples disclosed herein. In some instances, certain features of the embodiments can be employed without a corresponding use of other features as set forth. Many modifications, substitutions, and variations are possible in light of the above teachings, without departing from the scope of the claims.

What is claimed is:

1. An integrated circuit comprising:
   a first delay circuit to delay a first timing signal by an internal delay to generate an internal timing signal;
   a first interface circuit to communicate data to an external device in response to the internal timing signal;
   a second interface circuit to transmit an external timing signal for capturing the data in the external device; and
   a second delay circuit to delay the first timing signal by a second internal delay to generate a second internal timing signal, wherein the external timing signal is generated based on the second internal timing signal during a normal mode, and wherein the external timing signal is generated using a circuit path that bypasses the second delay circuit during a calibration mode.

2. The integrated circuit of claim 1, further comprising:
   a circuit to receive a phase comparison signal from the external device, wherein the first delay circuit sets the internal delay based on the phase comparison signal.

3. The integrated circuit of claim 1, further comprising:
   a multiplexer circuit configurable to cause the first interface circuit to communicate the data in response to the first timing signal or the internal timing signal.

4. The integrated circuit of claim 1, wherein the external timing signal is generated based on the first timing signal during the calibration mode.

5. The integrated circuit of claim 1, wherein the internal delay is adjusted to cause the first interface circuit to communicate the data with an approximate quadrature-phase relationship with the external timing signal.

6. The integrated circuit of claim 1, wherein the external device comprises a memory circuit, and wherein the first interface circuit communicates the data during a write operation to the memory circuit.

7. A method comprising:
   delaying a first timing signal by an internal delay using a first delay circuit to generate an internal timing signal;
   communicating data to an external device using a first interface circuit in response to the internal timing signal;
   transmitting an external timing signal for capturing the data in the external device using a second interface circuit, wherein an external delay is added to the external timing signal in the external device to generate a delayed external timing signal;
   setting the internal delay of the first delay circuit based on a comparison in the external device between the delayed external timing signal and a signal transmitted by the first interface circuit; and
   delaying the first timing signal by a second internal delay using a second delay circuit to generate a second internal timing signal, wherein the external timing signal is generated based on the second internal timing signal during a normal mode, and wherein the external timing signal is generated using a circuit path that bypasses the second delay circuit during a calibration mode.

8. The method of claim 7 further comprising:
   adjusting the internal delay to substantially match the external delay.

9. The method of claim 7 further comprising:
   generating the external timing signal based on the first timing signal during the calibration mode.

10. The method of claim 7, wherein the external delay is caused by a buffer circuit to drive the delayed external timing signal to a plurality of data capture circuits in the external device.

11. The method of claim 7, wherein communicating data to an external device using a first interface circuit in response to the internal timing signal comprises communicating the data during a write operation to a memory circuit in the external device.

12. The method of claim 7, further comprising:
   selectively causing the first interface circuit to communicate the data in response to the first timing signal or the internal timing signal.

13. The method of claim 7, wherein the internal delay is adjustable, and the external delay is non-adjustable.

14. The method of claim 7, further comprising:
   adjusting the internal delay to cause the first interface circuit to communicate the data with an approximate quadrature-phase relationship with the external timing signal.

* * * * *